United States Patent
Engel

(10) Patent No.: US 11,063,164 B1
(45) Date of Patent: Jul. 13, 2021

(54) METHOD AND MATERIALS TO MANUFACTURE HETEROJUNCTIONS, DIODES, AND SOLAR CELLS

(71) Applicant: Allen Howard Engel, Auburn, WA (US)

(72) Inventor: Allen Howard Engel, Auburn, WA (US)

( * ) Notice: Subject to any disclaimer, the term of this patent is extended or adjusted under 35 U.S.C. 154(b) by 0 days.

(21) Appl. No.: 16/999,003

(22) Filed: Sep. 17, 2020

(51) Int. Cl.
| | |
|---|---|
| H01L 31/00 | (2006.01) |
| H01L 31/0384 | (2006.01) |
| H01L 29/24 | (2006.01) |
| H01L 29/06 | (2006.01) |
| H01L 31/078 | (2012.01) |
| H01L 31/072 | (2012.01) |
| H01L 31/032 | (2006.01) |
| H01L 29/861 | (2006.01) |
| H01L 29/866 | (2006.01) |
| H01L 29/872 | (2006.01) |

(52) U.S. Cl.
CPC ...... *H01L 31/0384* (2013.01); *H01L 29/0649* (2013.01); *H01L 29/0665* (2013.01); *H01L 29/24* (2013.01); *H01L 31/072* (2013.01); *H01L 31/078* (2013.01); *H01L 29/861* (2013.01); *H01L 29/866* (2013.01); *H01L 29/872* (2013.01); *H01L 31/0324* (2013.01)

(58) Field of Classification Search
CPC . H01L 31/0384; H01L 31/072; H01L 31/078; H01L 31/0324; H01L 29/0649; H01L 29/0665; H01L 29/24; H01L 29/861; H01L 29/866; H01L 29/872
See application file for complete search history.

(56) References Cited

U.S. PATENT DOCUMENTS

| | | | |
|---|---|---|---|
| 8,066,967 B2 | 11/2011 | Eberlein et al. | |
| 9,964,856 B2 | 5/2018 | Maul | |
| 2011/0088782 A1* | 4/2011 | Shirata | H01L 31/0749 136/262 |
| 2017/0069839 A1* | 3/2017 | Troyan | H01L 45/1253 |

OTHER PUBLICATIONS

Xu, Qi, etal. Construction of Planar and Bulk Integrated Heterojunction Polymer Solar Cells . . . ACS Appl. Mater. Interfaces 2013, 5, 14, 6591-6597.
Shi, Weilin, etal., Photovoltaic Effect in Graphene/MoS2/Si Van der Waals Heterostructures Coatings 2018, 8,2.
Shanmugam, Mariyappan etal., Two-dimensional layered semiconductor/ graphene heterostructures for solar photovoltaic applications Nanoscale, 2014, 6, 12682.
Tsuboi, Yuka etal., Enhanced Photovoltaic Performances of Graphene/Si Solar Cells by Insertion of an MoS2 Thin Film, Nanoscale, 2015,7, 14476-14482, Royal Society of Chemistry.
Shim, Jaewoo, etal., Electronic and Optoelectronic Devices based onTwo-Dimensional Materials: From Fabrication to Application Adv. Electron. Mater. 2017, 3, 1600364.

(Continued)

*Primary Examiner* — Calvin Y Choi

(57) ABSTRACT

Novel heterojunctions, diodes, electrodes, and solar cells are comprised of semiconductive dichalcogenide flakes and metals or semi-metals like graphene. The dichalcogenide flakes and graphene flakes are deposed approximately normal to the device, enabling ohmic contact and mass production at low cost using printing equipment.

7 Claims, 10 Drawing Sheets

(56) References Cited

OTHER PUBLICATIONS

Stanford, M.G. etal., Emerging nanofabrication and quantum confinement techniques for 2D materials beyond graphene. npj 2D Mater Appl 2, 20 (2018).

Mak, Kin Fai, etal., Atomically thin MoS2: A new direct-gap semiconductor, no date, internet hyperlink, Publisher : arXiv https://arxiv.org/ftp/arxiv/papers/1004/1004.0546.pdf.

Bertolazzi, Simone, etal., Stretching and Breaking of Ultrathin MoS2 ACS Nano Nov. 16, 2011, 5, 12, 9703-9709.

Moeck, Andreas, etal., Shrinkage of UV Oligomers and Monomers Date unknown 2014,internet hyperlink, Publisher : Radtech https://radtech.org/proceedings/2-14/papers/Formulation.

Voiry, Damien, etal., Phase engineering of Transition Metal Dichalcogenides, Chemical Society Reviews, Apr. 3, 2015,44, 2702-2712, Royal Society of Chemistry.

Bhattacharyya, Swastibrata etal.,Effect of strain on electronic and thermoelectric properties of few layers to bulk MoS2, internet hyperlink, Publisher : arXiv, 2014, https://.

Naujoks, Nicola, Electrostatic field guided assembly of nanoscale objects in nonpolar liquids . . . ,2005, thesis, internet hyperlink : https://doi.org/10.3929/ethz-a-005067996.

Wai Kian Tan etal., Micro- and Nano-assembly of Composite Particles by Electrostatic Adsorption, Nanoscale Research Letters (2019) 14:297 https://doi.org/10.1186/s11671-019-31.

Seeman, Livia, Electrostatic field-directed assembly of particles and molecules from polar solution, 2009, thesis, internet hyperlink https://doi.org/10.3929/ethz-a-006002129.

Akama, Toshsiki etal., Schottky solar cell using few-layered transition metal dichalcogenides . . . Scientific Reports,7,11967 (2017).

Bernardi, Marco etal., Extraordinary Sunlight Absorption and 1 nm-Thick Photovoltaics using Two-Dimensional . . . Nano Lett., Jun. 10, 2013 2013, 13, 8, 3664-3670.

* cited by examiner

METHOD AND MATERIALS TO MANUFACTURE HETEROJUNCTIONS, DIODES, AND SOLAR CELLS

BACKGROUND

Since the discovery of Graphene, scientists worldwide have discovered many new uses for (so called) 2 dimensional materials. Scientists have made prototypes of 2 dimensional ("2D") rectifiers with high switching speeds, 2D transistors with minuscule dark currents, 2D abrasion resistant coatings, simple 2D heterojunction solar cells, 2D phototransistors, 2D hydrogen evolution reaction devices, electrodes for batteries, electrodes for supercapacitors, and more.

In general scientists have made these prototypes one dichalcogenide flake at a time, using demanding, expensive, and time consuming processes. The processes that the scientists teach are generally not suitable for low cost mass production.

U.S. Pat. No. 9,964,846, May 2018, Geohegan etal. claims a method for "depositing a lithographic mask on a two dimensional material, forming a pattern of masked regions and exposed regions on a (lateral) or vertical heterojunctions, and depositing atoms in the exposed regions.

The scope of U.S. Pat. No. 9,964,846, May 2018, Geoghegan etal. does not overlap this present application, since this present application describes depositing flakes with a normal orientation into a dielectric layer to manufacture heterojunctions, diodes and solar cells.

Ma etal. (12), Shi etal. (13), Shanmugam etal. (14), Tsuboi etal. (15)—all these scientists teach a heterojunction solar cell with a Schottky-Barrier, similar to this construction: Graphene layer/$MoS_2$ layer/Silicon wafer. This construction is for a stacked solar cell, not a solar cell wherein the constituent flakes are deposed approximately normal to the device substrate. Also, because silicon is not readily available in flake form, the assembly of the three layers of this type of solar cell construction is challenging for mass production.

It would be an advance in the art if 2D devices could be mass produced using low cost manufacturing processes, like printing processes.

DETAILED DESCRIPTION OF THE DRAWINGS

Figure 1A:
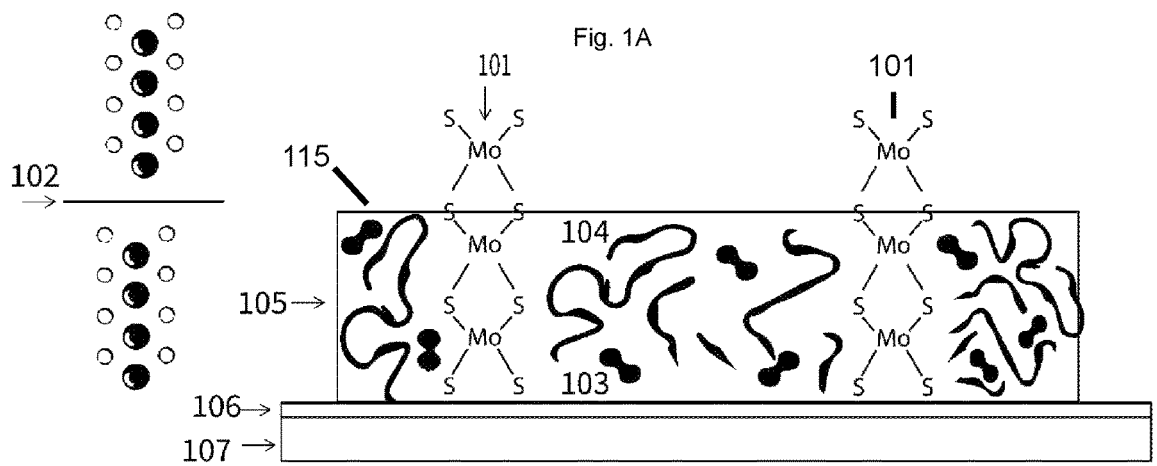
FIG. 1 illustrates a P-N heterojunction formed as compressive strain shifts the crystal lattice structure of the dichalcogenide particle from semiconductive conductivity to metallic conductivity.
Figure 1B:
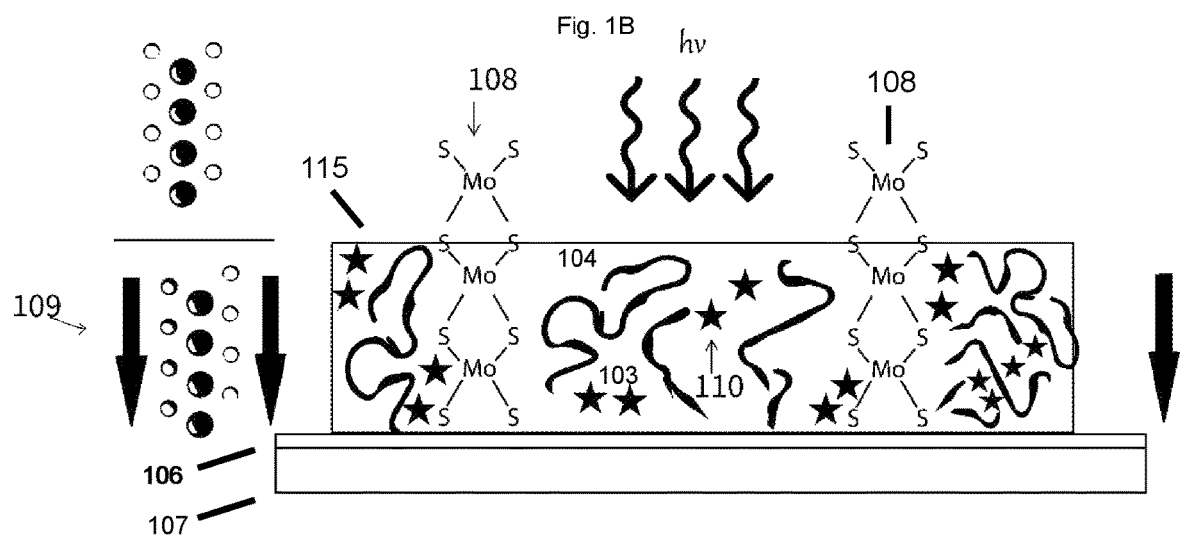
Figure 1C:
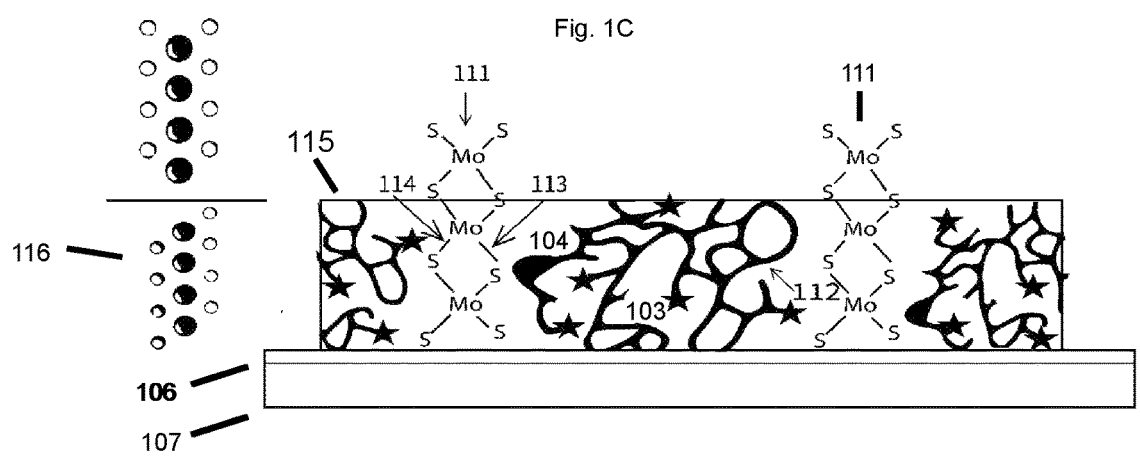

FIG. 1A-1C are side view illustrations of the the increasing of the crosslinking density of the dielectric layer 105, causing compressive forces and converting the buried portions of the dichalcogenide particles 101 to an octahedral geometry, changing the buried portions of the dichalcogenide particles 101 to a metallic conductivity.

In FIG. 1A a substrate 107 contacts a bottom electrode 106. The bottom electrode 106 contacts dielectric layer 105. Dielectric layer 105 has a top surface 115. The dielectric layer 105 includes a plurality of photoinitiator molecules 103, and a mixture of polymers 104 that can be crosslinked. Some of the polymers 104 increase in crosslink density when irradiated with additional energy, causing the volume of the dielectric resin 105 to shrink. A plurality of dichalcogenide particles 101 are deposed into the dielectric layer 105 and contact the bottom electrode 106. A portion of the plurality of dichalcogenide particles 101 protrudes through the top surface 115 of dielectric layer 105. Prior to irradiation, dichalcogenide particles 101 have semiconductive conductivity. 102 is a drawing of the dichalcogenide before compression.

In FIG. 1B, a sideview illustration, additional energy irradiates the dielectric layer 105 and the dichalcogenide flakes newly designated 108. Upon irradiation the photoinitiators radically cleave 110, and the polymers 104 polymerize, causing the dielectric layer 105 to start shrinking in volume, as shown in the crystal lattice structure 109. Coincidentally as the dielectric layer 105 shrinks in volume, the compressive force resulting from the volume reduction 109 begins compressing the plurality of dichalcogenide particles 108 to a transitional phase, to begin to shift in geometry to a less semiconductive, more metallic phase within the dielectric layer 105, meanwhile the plurality of dichalcogenide particles 108 retain their semiconductive conductivity above the top surface 115 of the dielectric layer 105.

FIG. 1C. describes the final state of the plurality of dichalcogenide particles, newly designated 111, partly buried within the dielectric layer 105. Protruding above the top surface 115 of the dielectric layer 105 the plurality of dichalcogenide particles 111 retains its semiconducting phase. Buried in the dielectric layer, the plurality of dichalcogenide particles 111 have undergone shrinkage leading to an alteration in their crystal lattice structure and a phase transition to a metallic phase as shown by 116. Newly designated 112 represents the polymerized dielectric layer which fixes the positions of the bonds of the crystal lattice structure of the plurality of dichalcogenide particles. 113 and 114 describe the bond lengths shift of the crystal lattice structure from a trigonal prismatic geometry to that of a metallic octahedral geometry. This shifting of the bond lengths of the crystal lattice structure reduces the band gap between the valence bands and conduction bands of the plurality of dichalcogenide particles buried with the dielectric layer 105, allowing conductor like charge transfer. 111—$MoS2$ has Van der Waals contact with the volume shrinking resin, and as the MoS$_2$ compresses, it transforms into a metallic phase, Above the resin MoS$_2$ retains semiconductive nature. 112—UV (ultraviolet) resin completely polymerized and solidified. 113/114—Bond lengths are altered from compression creating an octahedral geometry. Referring to FIG. 1A, one embodiment is described in relation to UV compression of the semi conducting material 101. The Semiconductor 101 is contained within the UV curing resin, 105. Also within the UV resin are photo initiator molecules 103, as well as crosslinking photopolymers, 104. The UV Resin containing 101, 103 and 104 is in direct contact with 106, a conductive AlOx (Aluminum Oxide) coating on top of 107, a polyester film substrate. 102 describes the interface at the top of 105. Above the interface, 101 is uncoated and bare exhibiting it's natural semiconductive characteristics. Below 2, the flakes are embedded within the UV Resin prior to UV exposure.

FIG. 1B describes the relationship between UV exposure and the early stages of UV photopolymerization. The semiconducting material 108, experiences compressive strain from the polymerization and shrinkage of the resin. 109 describes the compressive force exhibited by the polymer shrinkage. 110 describes the radical cleavage of the photo initiator molecules.

Figure 2:
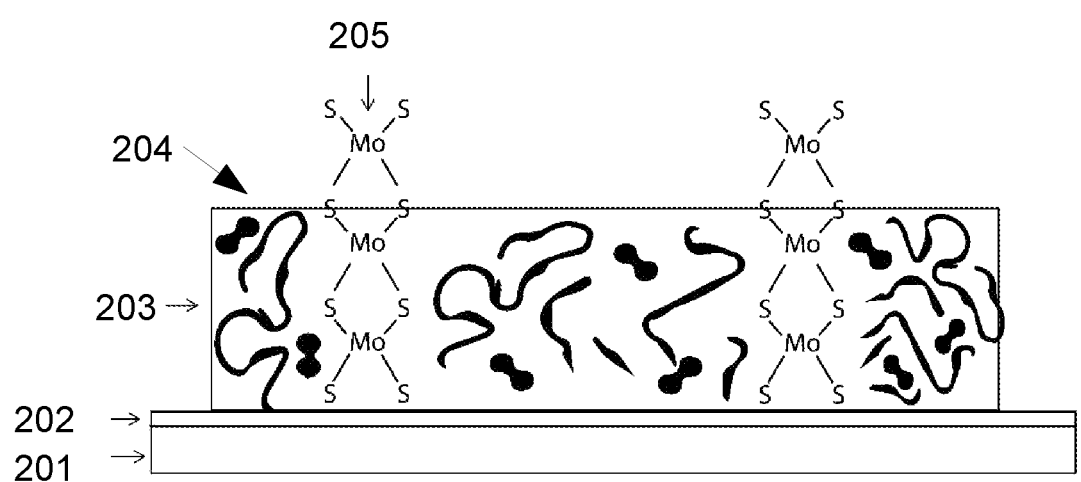
FIG. 2 illustrates a P-N heterojunction

FIG. 2 is a sideview illustration of a P-N heterojunction. Substrate 201 contacts P-type metal electrode 202. P-type metal electrode 202 contacts the dielectric layer 203. Dielectric layer 203 has a top surface 204. N-type Semiconductive Dichalcogenide Flake 205 contacts P-type metal electrode 202, forming the P-N heterojunction. A portion of Dichalcogenide Flake 205 is buried in Dielectric layer 203, and protrudes from the top surface 204 of dielectric layer 203.

Figure 3A:
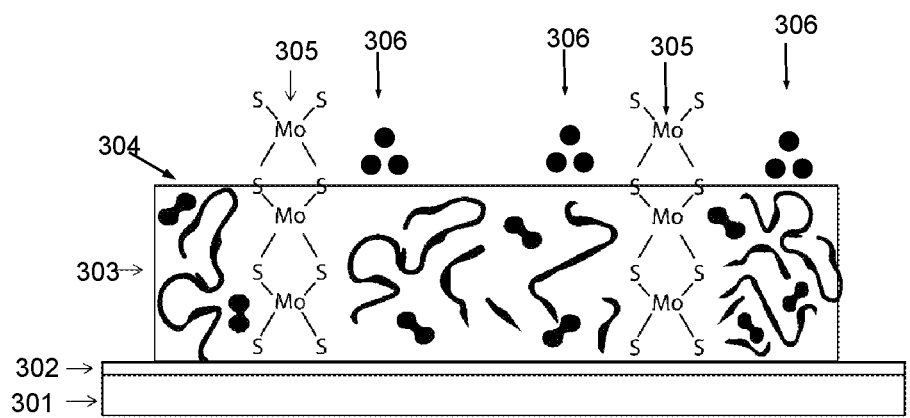
FIG. 3A, FIG. 3B, FIG. 3C illustrate a P-N heterojunction formed by deposing impurities to the protruding portions of the dichalcogenide particles, followed by irradiation of the device with additional energy, which forms vacancies in the dichalcogenide crystal lattice structure, followed by the diffusion and implanting of the impurities into the newly formed voids.
Figure 3B:
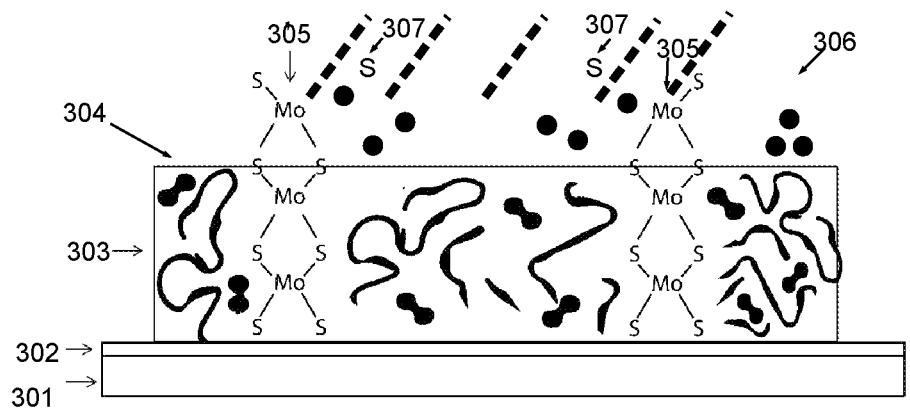
Figure 3C:
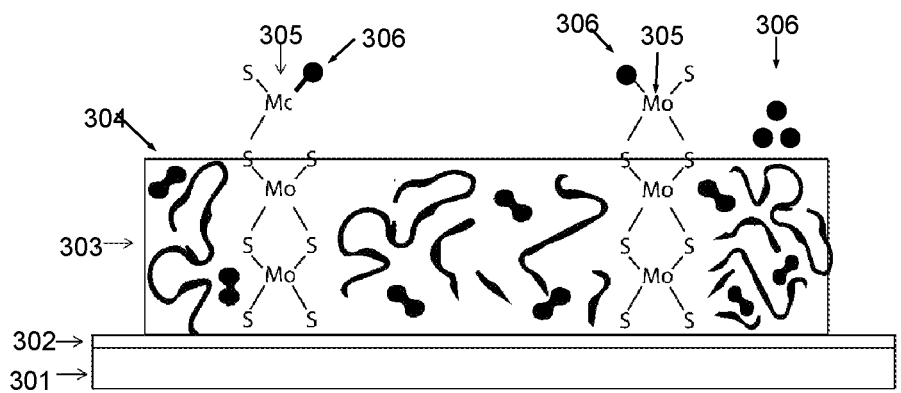

FIGS. 3A-3C are sideview illustrations of a heterojunction before, during, and after laser caused doping and changing the work function of portions of the plurality of dichalcogenide particles. In FIG. 3A Substrate 301 contacts Electrode 302. Electrode 302 contacts dielectric layer 303. Dielectric layer 303 functions as a mask, and inhibits the penetration of impurities 306 into the dielectric layer 303. Dielectric layer 303 has a top surface 304. A plurality of dichalcogenide particles 305 contacts electrode 302, and the dichalcogenide particles 305 protrude from the top surface 304 of dielectric layer 303. A plurality of impurities 306 resides on the top surface 304 of the dielectric layer 303, and some of the impurities 306 contact some of the plurality of dichalcogenide particles 305.

In FIG. 3B, additional energy is applied to the device, and in some embodiments a pulsed laser applies additional energy to the crystal lattice structure of the plurality of dichalcogenide particles 305, causing a plurality of impurities 306, (and in the embodiment illustrated, causing a plurality of sulfur atoms 307) to vacate from the plurality of dichalcogenide particles 305. The pulsed laser coincidentally causes the plurality of impurities 306 to dissociate.

In FIG. 3C, the plurality of newly dissociated impurities 306 occupy the vacancies left in the crystal lattice structure of the plurality of dichalcogenide particles 305. The impurities 306 occupying the former vacancies in the plurality of dichalcogenide particles 305, change the protruding portions of the dichalcogenide particles 305 to a work function of a second type, while the masked and buried portions of the dichalcogenide particles 305 retain the work function of the first type.

Figure 4:
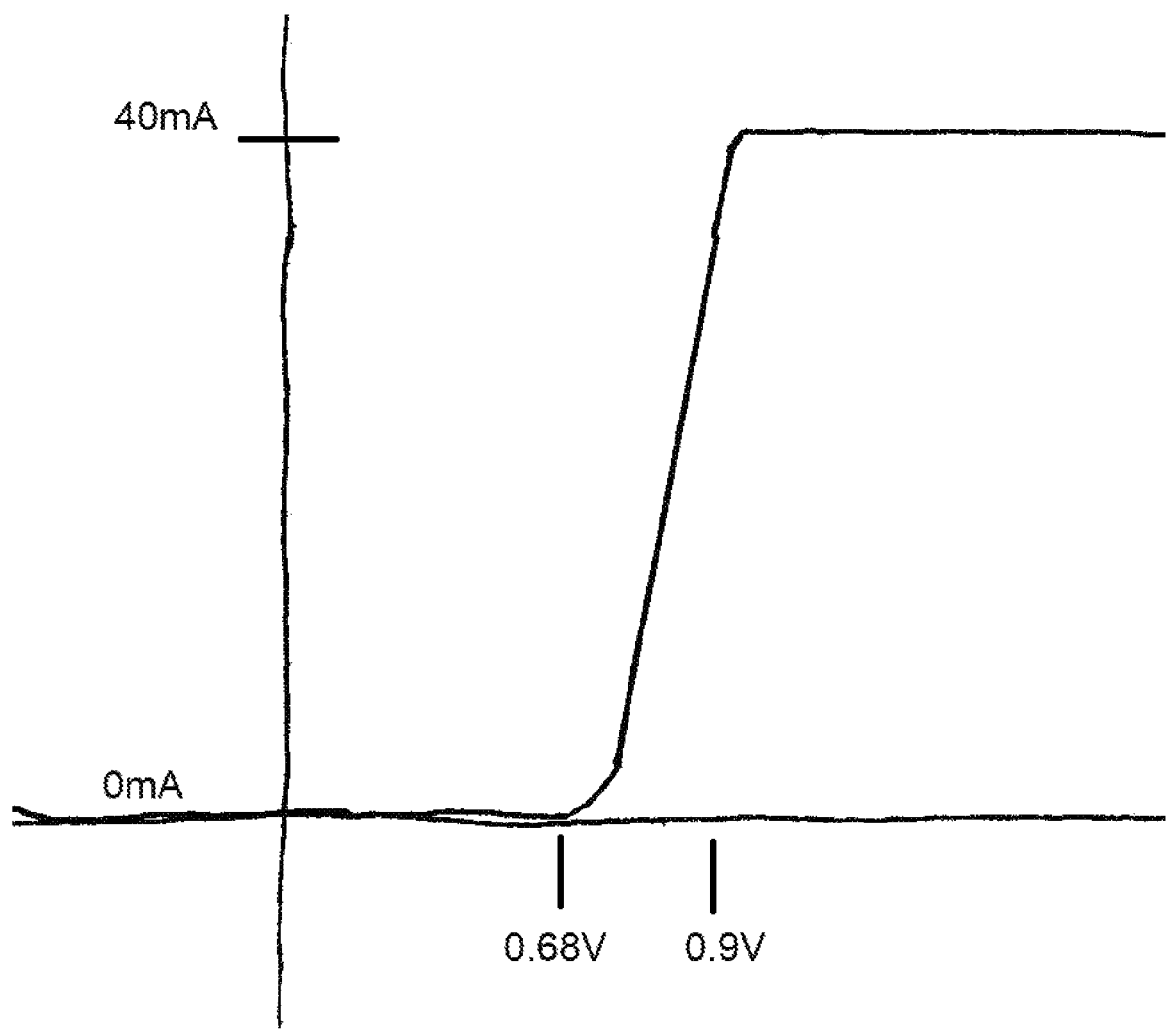
FIG. 4 illustrates the i-v curve of a prior art commercial zener diode

FIG. 4. illustrates the i-v curve of a prior art commercial zener diode

Figure 5:
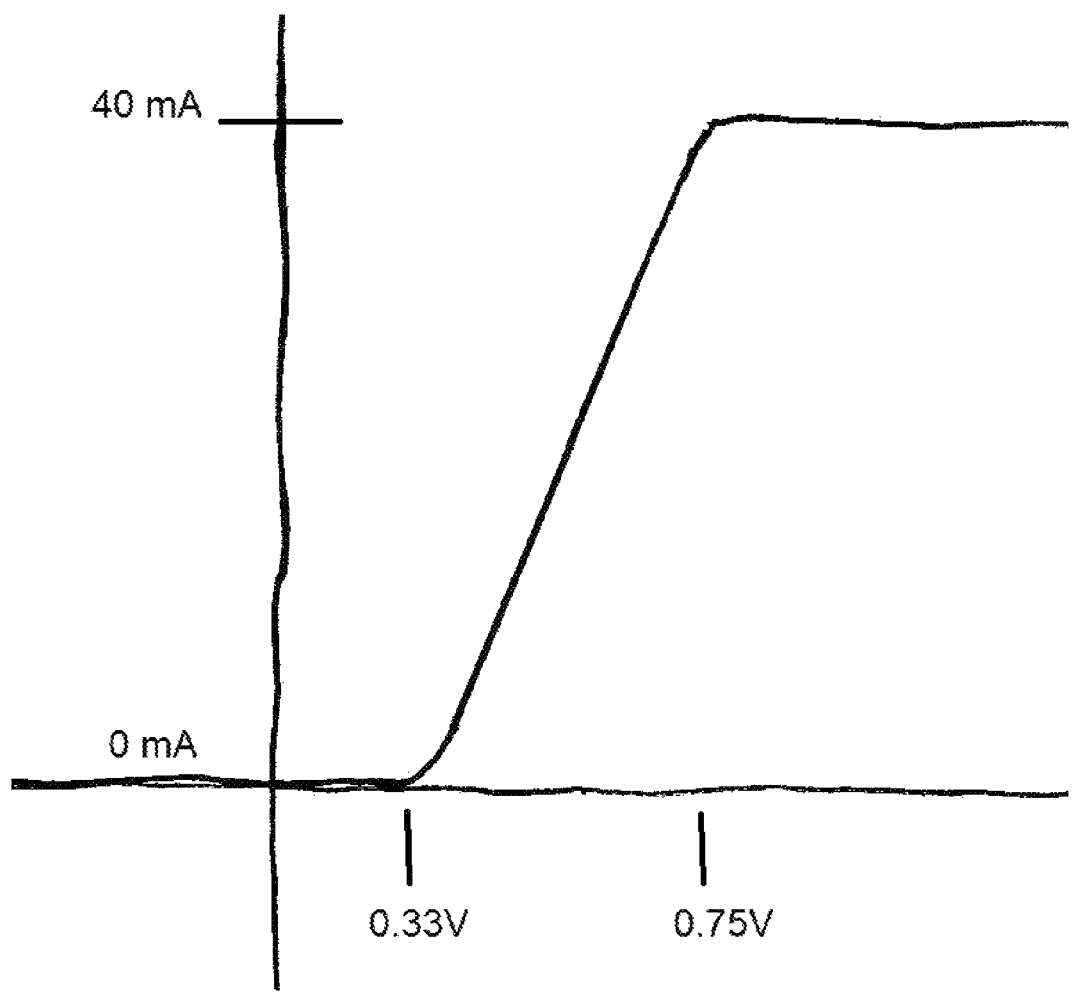
FIG. 5 illustrates the i-v curve of a prior art commercial Schottky diode

FIG. 5. illustrates the i-v curve of a prior art commercial Schottky diode

Figure 6:
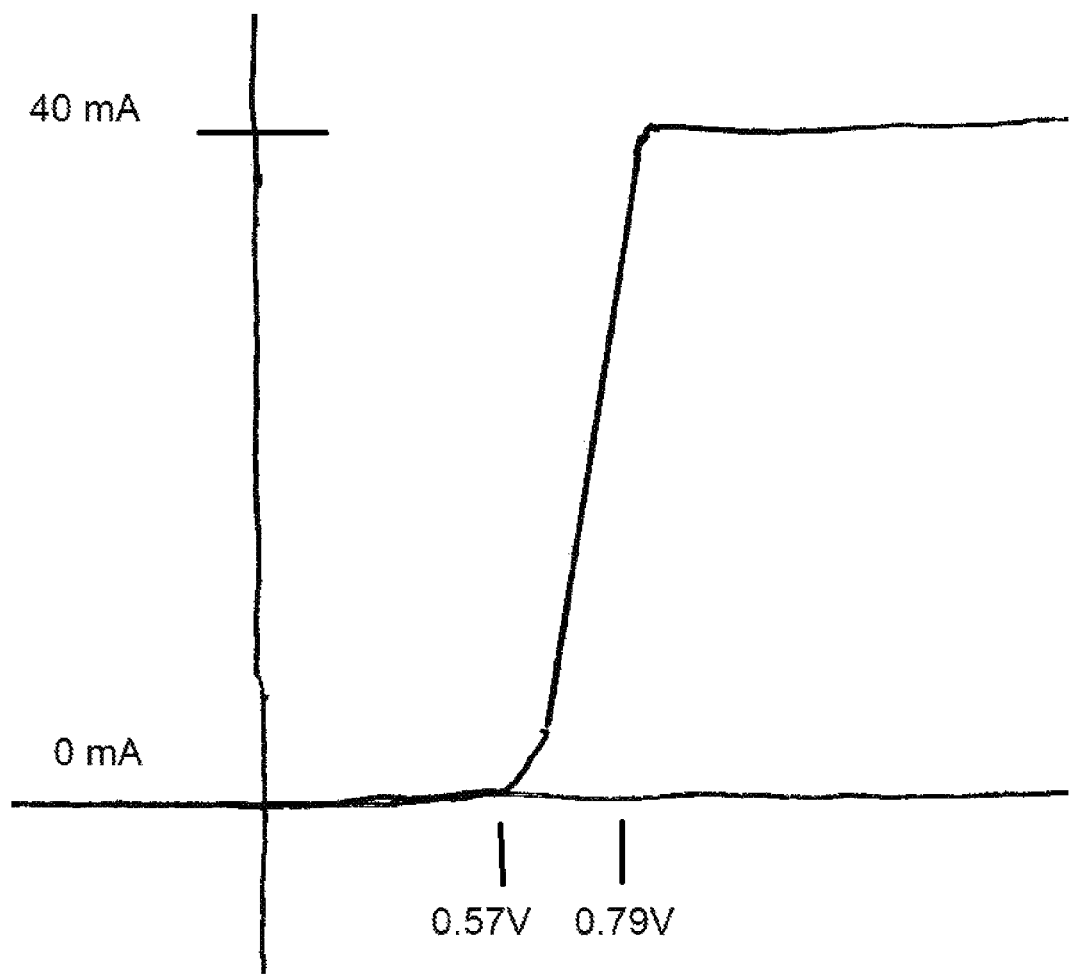
FIG. 6 illustrates the i-v curve of a prior art commercial diode for a rectifying circuit
Figure 7:
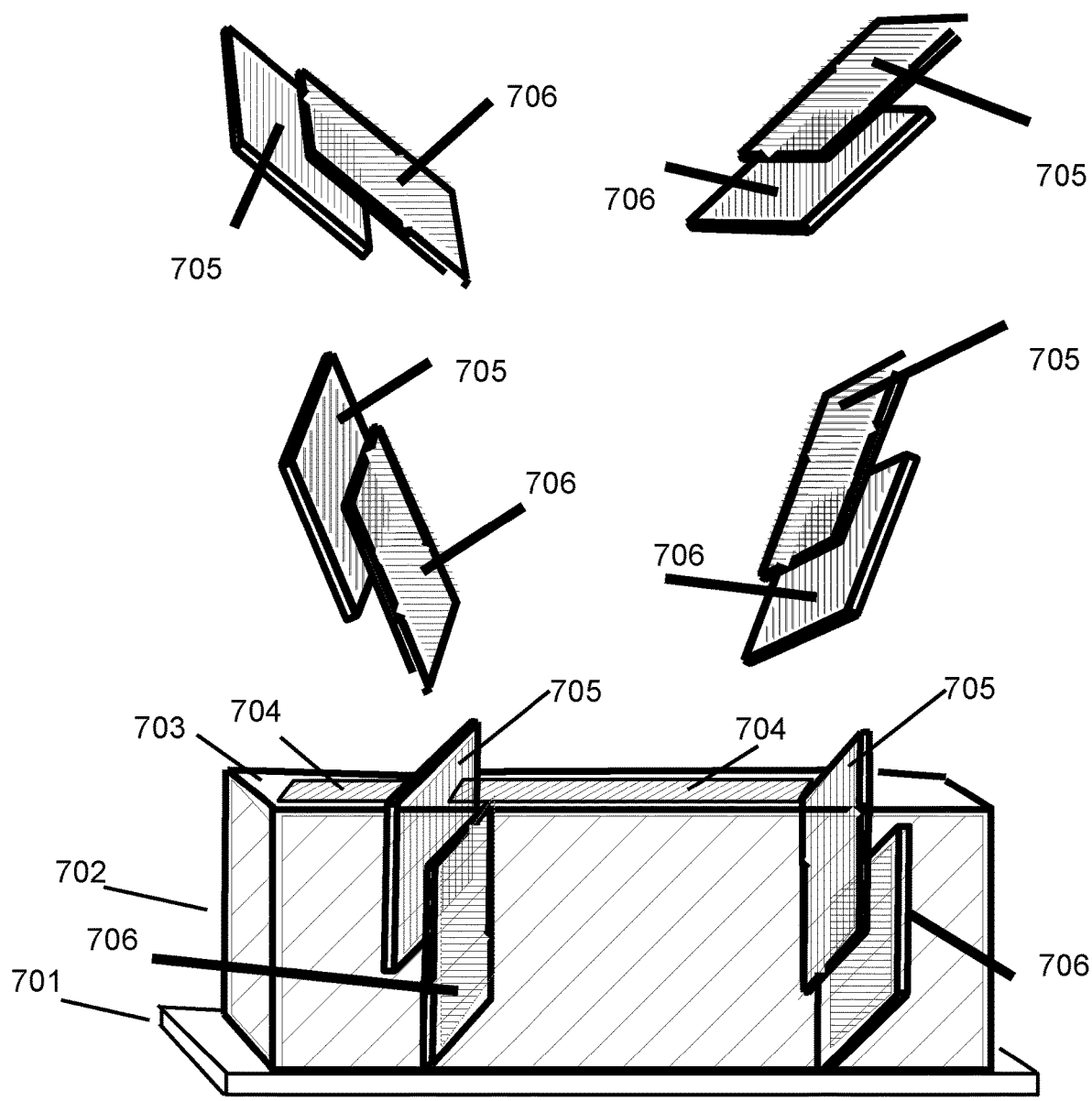
FIG. 7 illustrates the deposition of the composite heterojunction

FIG. 6. illustrates the i-v curve of a prior art commercial diode for a rectifying circuit FIG. 7. In this side view of a Composite Heterojunction, Substrate 701 with a potential charge contacts the dielectric layer 702. Dielectric layer 702 has a top surface 703. Top surface 703 contacts top electrode 704. Flake 705 with a first potential is bonded to Flake 706, which has a second potential, and the Flake 705 and Flake 706 form a layered composite heterojunction. A plurality of these layered composite heterojunctions are deposed to the device. Substrate 701 with potential charge of a first type attracts the layered composite heterojunction by electrostatic attraction. During the deposition, the electrostatic attraction perturbs the deposition motion of the plurality of layered composite heterojunctions, causing Flakes 706 with a second potential to be attracted to Substrate 701, which has an opposite potential. The electrostatic force attracts the plurality of layered composite heterojunction Flakes 705 bonded to Flakes 706 to pierce the top electrode 704, top surface 703, and to pierce the dielectric layer 702 and contact the substrate 701. Portions of layer flakes 705 protrude from the top surfaces 703 and the top electrodes 704 of dielectric layer 702.

Figure 8:
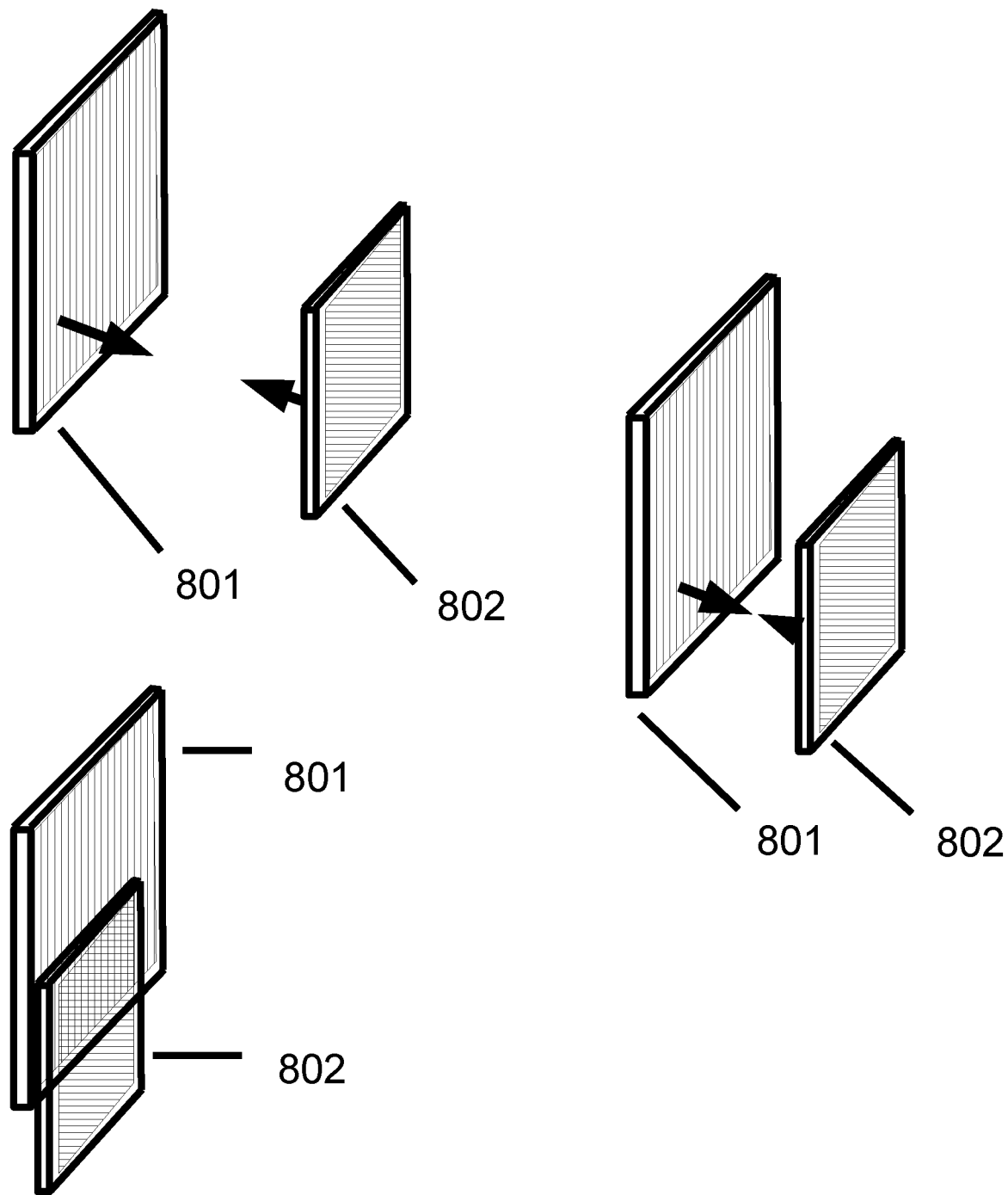
FIG. 8 illustrates a first flake layer having a first potential, being adsorbed to the surface of a second flake layer with an opposite potential due to electrostatic attraction, thereby forming a layered flake composite heterojunction

FIG. 8 illustrates the self assembly of the composite heterojunctions, as a plurality of dichalcogenide flakes 801 with a first potential are attracted by electrostatic attraction to a second plurality of flakes having metallic conductivity 802 and a second potential opposite that of the plurality of the dichalcogenide flakes 801.

Figure 9:
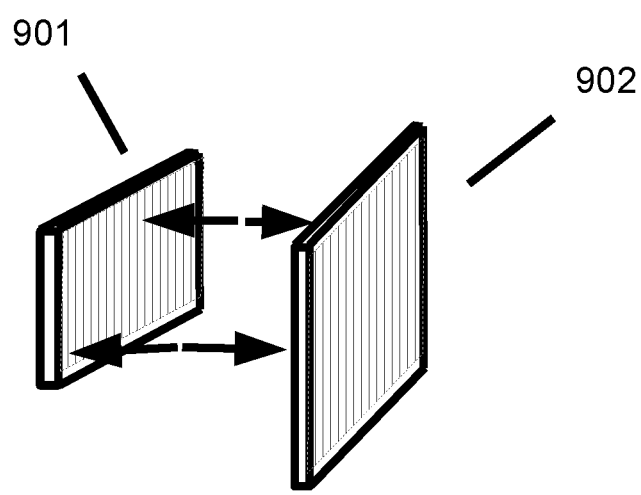
FIG. 9 illustrates a first flake layer having a potential, being repelled by a second flake layer having the same potential, being repelled due to electrostatic repulsion.
Figure 9:
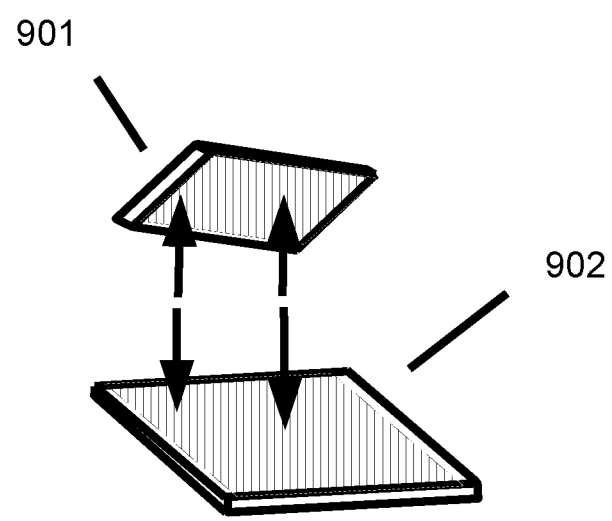

FIG. 9 illustrates a plurality of first flakes 901 having a potential, being repelled by a plurality of second flakes 902 having the same potential as the plurality of first flakes 901, being repelled due to electrostatic repulsion.

Figure 10:
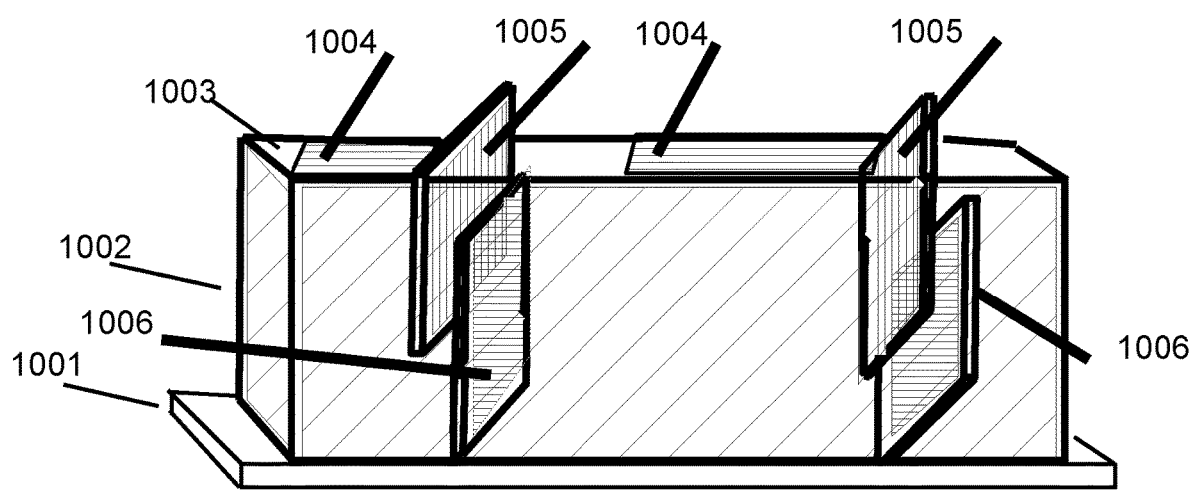
FIG. 10 Illustrates a P/Dichalcogenide/N solar cell with a Schottky-Barrier

FIG. 10. In Side view of P-Dichalcogenide-N Solar cell with Schottky-Barrier, Substrate 1001 contacts the dielectric layer 1002. Dielectric layer 1002 has a top surface 1003. Dichalcogenide flake 1005 protrudes from the top surface 1003 of dielectric layer 1002. P-type flake 1006 is bonded to Dichalcogenide Flake 1005. N-type flake 1004 contacts both the Dichalcogenide Flake 1005 and P-type flake 1006. P-type flake 1006 contacts substrate 1001.

Specification

Several advantages of one or more aspects are as follows: (A) Some embodiments incorporate heterojunction particles with ohmic contact, and hence have significant speed; (B) Some embodiments incorporate heterojunction particles which are simple to manufacture and depose; (C) Some embodiments are manufactured using ordinary printing equipment; (D) Some embodiments include flakes of various thicknesses, flakes which are more simple to manufacture than 2 dimensional flakes; (E) Some embodiments are transparent or semi-transparent; and (F) Some embodiments allow quick and facile doping of impurities to the heterojunctions. These and other benefits of one or more aspects of many embodiments will become apparent from a consideration of the ensuing description and accompanying drawings.

Molybdenum Disulfide Characteristics and Dichalcogenide Characteristics

Two-dimensional dichalcogenides exhibit distinctive properties from their 3-d (3 dimensional) counterparts and it is for this reason they have attracted huge interest over the past decade.

The fact that, at sub micron scales, 2d materials exhibit different behavior as compared to their 3d form can be of great advantage.

Transitional metal dichalcogenides, sometimes called tmd's or tmdc, in monolayer form are structurally stable, have bandgaps of approximately 1 eV-3 eV (electron volts) and exhibit electron mobilities comparable to those of silicon. Therefore they are excellent for fabrication of diodes, transistors, solar cells, electrodes, and other devices. $MoS_2$ has a direct bandgap of 1.8 ev in monolayer form and thus makes it applicable for switching and optoelectronic devices. Few and many layered $MoS_2$ also have novel bandgaps, however with increasing layers the band gap decreases.

Bulk $MoS_2$ is a diamagnetic, indirect bandgap semiconductor, with a bandgap of 1.23 eV. All forms of $MoS_2$ have a layered structure, in which a plane of molybdenum atoms is sandwiched between planes of sulfide ions. These three strata form a monolayer triad of $MoS_2$. Bulk $MoS_2$ consists of stacked triads, triads which are held together by weak Van der Waals interactions.

Crystalline $MoS_2$ naturally occurs in two phases, $2H-MoS_2$ and $3R-MoS_2$, where the "H" and the "R" indicate hexagonal and rhomboidal geometry, respectively. In these structures each molybdenum atom exists at the center of a trigonal prismatic coordination sphere and is covalently bound to six sulfide ions. Each sulfur atom has pyramidal coordination and is bound to three molybdenum atoms. Both the 2H- and 3R-phases are semiconducting phases of $MoS_2$.

The 1T form of $MoS_2$ is trigonal in its geometry. In this phase, $MoS_2$ exhibits metallic properties. The metallic phase has $\approx 10^5$ Siemens (or higher) electrical conductivity compared to the semiconducting phase. The 1T phase has superior electron transfer capability. Using 1T $MoS_2$ as an electrode will minimize or even eliminate the addition of any further conductive additives and simultaneously achieves an excellent rate performance for energy storage fields. $MoS_2$ is catalytic-ally inert for hydrogen evolution reaction (HER), whereas the basal planes of metallic 1T $MoS_2$ are rich in active sites, which has the benefit of higher reaction kinetics between electrons and protons (H+) on the active sites, and makes the 1T $MoS_2$ a promising candidate for energy generation and conversion.

In some embodiments, a dense composite electrode comprised of a layer of graphene and a layer of $MoS_2$ exhibits low interfacial impedance and has high specific capacity that is superior to the kinetic limitations of many other electrode materials for batteries or supercapacitors. Indeed a graphene flake layer is superior to a graphene oxide layer or reduced graphene layer since the native graphene flake has few defects and higher conductivity, as well as ohmic conductance with the $MoS_2$ flake, since the graphene flake is bound to the $MoS_2$ flake due to electrostatic attraction.

The $MoS_2$ flake has few or no dangling bonds. Along the thin edge of the flake, some of the Molybdenum atoms have valence domains which are available to form associations.

A typical $MoS_2$ monolayer is less than 7 Å (Angstroms) thick and the Van der Waals forces between the interlayers are very weak. Therefore, individual layers can be isolated using traditional mechanical cleavage techniques, such as chemical exfoliation, ball milling, and intercalation, among many other exfoliation techniques.

In [1], a systematic study of $MoS_2$ was performed to analyze the function of thickness (layers). With decreasing thickness, there was progressive confinement-induced shift in the indirect band gap from the bulk value of 1.29 eV to 1.90 eV. The $MoS_2$ crystals were observed to undergo a crossover from an indirect bandgap semiconductor to direct bandgap semiconductor when in the monolayer form. With monolayer $MoS_2$ there was an significant increase in photoluminescence (PL) Quantum yield (QY) of up to 1000 times as strong when compared to the bulk crystal. The PL QY observed for bulk $MoS_2$ samples was seen to be negligible whereas PL was observed for few-layer $MoS_2$ samples and for the monolayer $MoS_2$, the PL observed was the brightest.

$MoS_2$ is relatively nonreactive and has a low coefficient of friction. Weak interlayer Van der Walls interaction present between TMDCs facilitates the exfoliation of bulk crystal into few layer or monolayer crystals or flakes, which exhibit layer dependent properties. In addition, monolayer $MoS_2$ has a high electron mobility and high luminous efficiency, allowing high efficiency in photovoltaic fields, such as in field effect transistors and sensors.

Another important property of TMDC monolayers is their high exciton binding energy (~0.5-1 eV) arising from substantially reduced dielectric screening relative to the bulk. This promotes strong and long-lived excitons, making them suitable for LEDs, photo-markers, etc. Despite being atomically thin, the surfaces of $MoS_2$ 2D materials are self-passivized without any dangling bonds.

The monolayer $MoS_2$ is a crystalline structure, whereby the upper and lower layers are planes composed of sulfur atoms, and the middle is a layer of metal molybdenum atoms. Each molybdenum atom in the layer covalently bonds with six sulfur atoms to form the Mitsubishi columnar coordination structure. Meanwhile, each sulfur atom combines with three molybdenum atoms through covalent bonding.

$MoS_2$ is a layered semiconductor material with strong light absorption, so it can be applied to photoluminescence, photovoltaic, and photo-catalytic research. Since the surface-to-volume ratio of quasi-two-dimensional materials is extremely high, understanding their surface characteristics is also crucial for practically controlling their intrinsic properties and fabricating semiconductors, transistors, and diodes with p-type characteristics and n-type characteristics. The surface electron concentration of $MoS_2$ is nearly four orders of magnitude higher than that of its inner bulk. Van der Waals crystals without dangling bonds, such as $MoS_2$, are expected to have an inert surface and fewer surface states.

The structure of the layered metal dichalcogenides includes one hexagonal packed sheet of metal atoms sandwiched between two hexagonal sheets of chalcogen atoms. The coordination of the metal atoms by the chalcogen atoms is either hexagonal (e.g. titanium disulfide and Vanadium disulfide) or trigonal prismatic (e.g. molybdenum disulfide and niobium disulfide). The MX layers are kept together by Van der Waals forces and several stacking polytypes exist. There is weak bonding between layers, where a layer consists of a monolayer of metal atoms clad together by covalently bonded chalcogens.

The coordination and the oxidation state of the metal atom determine the electronic properties of the material. For example, the group V metal atoms (niobium and tantalum) are in a trigonal prismatic coordination and the corresponding dichalcogenide materials are metals, while group VI atoms (molybdenum and tungsten) are also in a trigonal prismatic coordination but have a full dz band and hence are semiconductors. Molybdenum disulfide has both a hexagonal and a trigonal prismatic coordination and can thus be either metallic or semiconducting respectively.

The average major axis length and the average thickness of the dichalcogenide flake shape are preferably from 0.5 microns to 25 microns and from 2 nanometer to 100 nanometers, respectively. The major axis of the dichalcogenide flake shape refers to the longest portion of the dichalcogenide flake shape when being observed from the thickness direction thereof.

In some embodiments the metallic component of the chalcogenide is titanium, Zirconium, hafnium, Vanadium, tantalum, niobium, molybdenum, tungsten, or tin. Or gallium, or indium, or thallium. Or two-dimensional semiconductor includes at least one of a transition metal dichalcogenide, a CdTe single-layer, Gas, GaSe, GaS1—Sez, CdI2, Pbl2, K2A14 (Si A12023) (OH, F) 4, Pbl2, K2A14 (Si A12023) (OH, F) 4, Molybdenum disulfide (MoS2), molybdenum diselenide (MoSe), molybdenum ditelluride (MoTex), tungsten disulfide (WS), tungsten diselenide (WSez), tungsten ditelluride (WTe), niobium disulfide (NbS), niobium diselenide (NbSez), niobium ditelluride (NbTex), tantalum disulfide (TaS_), tantalum diselenide (TaSe), tantalum ditelluride (TaTe), hafnium disulfide (HfS), hafnium diselenide (HfSez), hafnium ditelluride (HfTez), titanium disulfide (TiS), titanium diselenide (TiSex), and titanium ditelluride.

The layered metal chalcogenides include any compounds comprising metal atoms and chalcogen atoms in a layer-type structure. Examples include layered metal dichalcogenides and layered metal monochalcogenides. The layered metal dichalcogenides have the chemical formula MX wherein M represents a metal and X represents a chalcogen (i.e. sulfur, selenium or tellurium). The structure of the layered metal dichalcogenides preferably includes one sheet of metal atoms sandwiched between two sheets of chalcogen atoms. In the layered metal dichalcogenides, the metallic component M is preferably selected from transition metals Such as titanium, zirconium, hafnium, vanadium, tantalum, niobium, molybdenum and tungsten and non-transition metals such as tin. More preferred are niobium, molybdenum, tantalum, tin and tungsten, and most preferred are niobium, molybdenum and tantalum. More preferred chalcogens are sulfur, selenium and tellurium, and most preferred are sulfur and selenium. Metals that form monochalcogenides which may be suitable include gallium, indium and thallium.

The structure of the metal chalcogenides comprises sheets of metal atoms sandwiched between sheets of chalcogen atoms. In the layered metal dichalcogenides, for example, the metallic sheet is covalently bonded to the two adjacent sheets of chalcogens. Two adjacent MX layers are kept together by van der Waals forces. This structure leads to extremely anisotropic mechanical, chemical and electrical properties. Exposed surfaces of these materials have no dangling bonds and, hence, are chemically inert. This makes them particularly suitable for use as hole transport layers in FETs (Field Effect Transistors) as it removes the problem of chemical reactions at the interfaces with the organic semiconducting layer which would otherwise reduce the efficiency and effective lifetime of the FETs.

Chalcogenides are particularly of great interest to researchers worldwide due to their functionality and varied responses to optical, electrical and thermal stimuli. Besides, they also can switch, bend, self-organize and photo darken and have inherent infrared transparency, optical non-linearity, and semiconducting nature.

In some embodiments, the substrate is flexible, and the all the ingredients deposed on the substrate are themselves flexible, making a flexible device.

Bertolazzi etal. teaches "We find that the in-plane stiffness of monolayer $MoS_2$ is 180±60 Nm−1, corresponding to an effective Young's modulus of 270±100 GPa, which is comparable to that of steel. Breaking occurs at an effective strain between 6 and 11% with the average breaking strength of 15±3 Nm−1(23 GPa). The strength of strongest monolayer membranes is 11% of its Young's modulus, corresponding to the upper theoretical limit which indicates that the material can be highly crystalline and almost defect-free. Our results show that monolayer $MoS_2$ could be suitable for a variety of applications such as reinforcing elements in composites and for fabrication of flexible electronic devices. "[2]

$MoS_2$ Exfoliation Processes

Mechanical Exfoliation

Applying a sticky tape to a bulk crystal sample and then peeling it off will result in thin layers of crystal sticking to the tape. This is due to greater mutual adhesion than the interlayer adhesion. This sticking-and-peeling process can be repeated until single monolayers are produced. These can then be transferred onto a substrate (e.g. by a PDMS (polydimethylsilicone) stamp). While this process has a low monolayer yield, it produces high-quality crystalline monolayers that can be >10's microns in size. Despite being 'low-tech', it is still a preferred processing method for TMDC research.

Solvent Exfoliation

Crystals can be sonicated in an organic solvent breaking them down into thin layers. A distribution in the size and thickness of the layers is obtained, with a surfactant often added to stop the layers restacking.

Intercalation

Bulk crystals are placed in a solution which acts as a source of lithium ions (commonly n-butyllithium dissolved in hexane), which diffuse between the layers of the crystal. After this, water is added which then interacts with the lithium ions to produce hydrogen, pushing the layers apart. This method requires careful control over the experimental parameters in order to obtain a high monolayer yield. The resulting layers also tend to have the less desirable metallic 1T structure rather than the semiconducting 2H structure. The 1T structure can however be converted to the 2H through thermal annealing.

Vapor Deposition

Chemical vapor deposition involves a chemical reaction to convert a precursor to the final $MoS_2$. Commonly, MoO3 is annealed at high temperature (~1000° C.) in the presence of Sulfur to produce $MoS_2$ films.

A promising alternative route to $MoS_2$ monolayer growth is through physical vapor deposition, where $MoS_2$ powder is used directly as the source. This can yield high-quality monolayer flakes (up to 25 microns in size) which display optical properties commensurate with exfoliated layers.

After exfoliation, the $MoS_2$ triads have a flake shape, with a thickness measuring in nanometers. The length and width of the flakes measure in nanometers to micrometers in size. In some embodiments, the flake shape is 0.5 nanometers to 100 nanometers thick, with longest lateral dimensions from 0.3 microns to 100 microns.

Semiconductor Diodes

A PN-junction diode is formed when an N-type material is fused together with a P-type material creating a potential barrier voltage across the diode junction. It has a characteristic such that ideally it allows flow of current in one direction and blocks in the opposite direction. However, unlike a resistor, a diode does not behave linearly with respect to the applied voltage as the diode has an exponential current-voltage (I-V) relationship and therefore we cannot describe its operation by simply using an equation such as Ohm's law.

But before we can use the PN junction as a practical device or as a rectifying device we need to firstly bias the junction, i.e. connect a voltage potential across it. On the voltage axis above, "Reverse Bias" refers to an external voltage potential which increases the potential barrier. An external voltage which decreases the potential barrier is said to act in the "Forward Bias" direction.

There are two operating regions and three possible "biasing" conditions for the standard Junction Diode and these are:

1. Zero Bias—No external voltage potential is applied to the PN junction diode.
2. Reverse Bias—The voltage potential is connected negative, (−ve) to the P-type material and positive, (+ve) to the N-type material across the diode which has the effect of Increasing the PN junction diode's width.
3. Forward Bias—The voltage potential is connected positive, (+ve) to the P-type material and negative, (−ve) to the N-type material across the diode which has the effect of Decreasing the PN junction diodes width.

When a diode is connected in a Zero Bias condition, no external potential energy is applied to the PN junction. However if the diodes terminals are shorted together, a few holes (majority carriers) in the P-type material with enough energy to overcome the potential barrier will move across the junction against this barrier potential. This is known as the "Forward Current" and is referenced as $I_F$.

Likewise, holes generated in the N-type material (minority carriers), find this situation favorable and move across the junction in the opposite direction. This is known as the "Reverse Current" and is referenced as $I_R$. This transfer of electrons and holes back and forth across the PN junction is known as diffusion.

The potential barrier that exists in this condition discourages the diffusion of any more majority carriers across the junction. However, the potential barrier helps minority carriers (few free electrons in the P-region and few holes in the N-region) to drift across the junction.

Then an "Equilibrium" or balance will be established when the majority carriers are equal and both moving in opposite directions, so that the net result is zero current flowing in the circuit. When this occurs, the junction is said to be in a state of "Dynamic Equilibrium". The minority carriers are constantly generated due to thermal energy so this state of equilibrium can be broken by raising the temperature of the PN junction causing an increase in the generation of minority carriers, thereby resulting in an increase in leakage current but an electric current cannot flow since no circuit has been connected to the PN junction.

Reverse Biased PN Junction Diode

When a diode is connected in a Reverse Bias condition, a positive voltage is applied to the N-type material and a negative voltage is applied to the P-type material. The positive voltage applied to the N-type material attracts electrons towards the positive electrode and away from the junction, while the holes in the P-type end are also attracted away from the junction towards the negative electrode. The net result is that the depletion layer grows wider due to a lack of electrons and holes and presents a high impedance path, almost an insulator. The result is that a high potential barrier is created thus preventing current from flowing through the semiconductor material.

This condition represents a high resistance value to the PN junction and practically zero current flows through the junction diode with an increase in bias voltage. However, a very small leakage current does flow through the junction which can be measured in micro-amperes, (μA).

If the reverse bias voltage Vr applied to the diode is increased to a sufficiently high enough value, it will cause the diode's PN junction to overheat and fail due to the avalanche effect around the junction. This may cause the diode to become shorted and will result in the flow of maximum circuit current.

Forward Biased PN Junction Diode

When a diode is connected in a Forward Bias condition, a negative voltage is applied to the N-type material and a positive voltage is applied to the P-type material. If this external voltage becomes greater than the value of the potential barrier, approx. 0.7 volts for silicon and 0.3 volts for germanium, the potential barriers opposition will be overcome and current will start to flow.

This is because the negative voltage pushes or repels electrons towards the junction giving them the energy to cross over and combine with the holes being pushed in the opposite direction towards the junction by the positive voltage. This results in a characteristics curve of zero current flowing up to this voltage point, called the "knee" on the static curves and then a high current flow through the diode with little increase in the external voltage The application of a forward biasing voltage on the junction diode results in the depletion layer becoming very thin and narrow which represents a low impedance path through the junction thereby allowing high currents to flow. The point at which this sudden increase in current takes place is represented on the static I-V characteristics curve above as the "knee" point.

This condition represents the low resistance path through the PN junction allowing very large currents to flow through the diode with only a small increase in bias voltage. The actual potential difference across the junction or diode is kept constant by the action of the depletion layer at approximately 0.3 v for germanium and approximately 0.7 v for silicon junction diodes. Since the diode can conduct "infinite" current above this knee point as it effectively becomes a short circuit, therefore resistors are used in series with the diode to limit its current flow. Exceeding its maximum forward current specification causes the device to dissipate more power in the form of heat than it was designed for resulting in a very quick failure of the device.

Laser Doped Heterojunctions

Implanting impurities into dichalcogenides using laser beam energy is similar to the doping of silicon using dopants and laser energy.

The laser serves two major functions: (i) creation of sulfur vacancies in the dichalcogenide flakes and coincidentally (ii) breaking the bonds of the dopant impurities and then the released ions and fragments then diffuse and implant into the empty sulfur vacancy sites within the crystal lattice structure of the dichalcogenide.

In our workshop in one embodiment we doped $MoS_2$ by irradiating it using a 450 nanometer laser, in another embodiment a 523 nanometer laser, and in another embodiment a 780 nanometer laser.

Laser doping is a means to change the work function of a material to be more p or more n. For $MoS_2$, the following exemplary and non-exclusive dopants function to change the $MoS_2$ to be more N-type: PVA (polyvinyl alcohol), BV (Benzyl Viologen). P-type dopants for $MoS_2$ are $O_2$ (Oxygen), and AuCl3 (Gold Chloride).

The dopants are deposed proximal to the dichalcogenides. The dopant can be in a liquid solution and deposed onto the dichalcogenide or proximal to the dichalcogenide, or the dopant can be deposited as a powder on to the dichalcogenide, and in some embodiments the dopant can be in a gaseous state.

Laser doping of dichalcogenides differs from the doping of silicon as the laser doping of monolayer and few layer dichalcogenides is very fast, and because the dopants are implanted throughout the flake layers. In some embodiments, the masking of the dichalcogenide flakes is quite simple, as the top surface of the dielectric layer forms an impenetrable barrier to the impurities, and also attenuates the laser energy.

Silicon wafers require considerably more time to reach sufficient doping compared to dichalcogenides, due to the thickness of the silicon wafer, to achieve a sufficient level of doping within the first few hundred nanometers of the thickness profile of the wafer.

With dichalcogenides, however, after exfoliation, the dichalcogenides are sometimes monolayer, few layer, and many layer. Since the dichalcogenides are thin flake shaped, the dopant impurities can quickly penetrate within the few nanometer thick profile of the dichalcogenide within short time durations (e.g. immediately).

Since the dichalcogenides dope so quickly, in some embodiments the flakes can be laser irradiated and doped continuously using a printing press.

In our workshop we repeatedly doped exfoliated $MoS_2$ using a 0.5 mW low power 780 nanometer laser, and the doping was immediate. The irradiating was also immediate when we used a 450 nanometer laser and a 523 nanometer laser.

In our workshop we observed that some of the dielectric layer ingredients can inhibit the diffusion of the dopants into the portions of the flakes which were buried within the resin. We also inferred that some of the laser light was attenuated by the dielectric layer ingredients and did not significantly affect the other layers buried beneath the surface of the resin "mask", including the electrode underneath.

In our workshop we practised prototyping some non-limiting embodiments with these simplified processing steps:

a. Provide a bottom electrode
b. Optionally coat a charge transfer layer
c. Coat a liquid dielectric layer including ultraviolet curing resins on to the bottom electrode
d. Depose a plurality of dichalcogenide flakes into the dielectric layer, wherein portions of the flake ends are buried in the dielectric layer, and portions of the opposite ends of the flakes protrude from the layer,
e. Expose the dielectric layer to 365-415 nanometer light to change the dielectric layer from a low viscosity liquid to a gel, or a stiff gel, or a solid. (In some embodiments, the volume of the resin shrank during exposure to ultraviolet light, and compressed the buried portions of the flakes.)
f. Coat the dilute dopant solution onto the area occupied by the protruding flake ends and the resin surrounding the flake ends, and dry off the excess liquid solution.
g. Expose the molybdenum flakes and the dopant impurities to laser irradiation. Some of the sulfurs of the $MoS_2$ vacate the $MoS_2$ crystal lattice structure coincident with the laser breaking the bonds of the impurities, and release ions or fragments that diffuse and implant into the vacancies formerly occupied by the sulfurs.
h. Optionally apply a charge transfer layer.
i. Apply a top electrode A laser beam is a device that emits light through a process of optical amplification based on the simulated emission of electromagnetic radiation.

Electron-beam curing is a method of curing paints and inks without the need for traditional solvent. Electron-beam curing produces a finish similar to that of traditional solvent-evaporation processes, but achieves that finish through a polymerization process, typically without using photoinitiators.

Ion beams can also cure acrylates similar to laser beams or electron beams.

Dissociation in chemistry is a general process in which molecules (or ionic compounds such as salts and complexes) separate or split into smaller particles such as atoms, ions, or radicals.

Compressive Strain Induced Heterojunctions

During crosslinking of some ultraviolet curing resins, the volume dimensions of the ultraviolet coating shrinks and compresses. This is called by some as NC, or normal compression. Moeck etal. (3) of Rahn teach "The volume shrinkage of acrylates and methacrylates occurs during polymerization and is due to the replacement of long-distance connections via weak Van der Waals force by strong short covalent bonds between the carbon atoms of different monomer units. This volume shrinkage causes serious problems including a large build-up of internal stress, which results in defects formation, and dimensional changes . . . ."

Voiry etal. (4) teach: " . . . different phases in single layer TMDs can also be realized. A single layer of TMDs can have a trigonal prismatic" (crystal lattice structure) "phase or an octahedral" (crystal lattice structure) "phase. The trigonal prismatic phase, is also referred to as the 2H phase (or 1H in the case of a single-layer) and can be described by a hexagonal symmetry (D3h group) and corresponds to a trigonal prismatic coordination for the metal atoms. This geometry means that in single-layers, the sulfur atoms are vertically aligned along the z-axis and the stacking sequence is then AbA where A and b denote chalcogen and metal atoms, respectively The octahedral phase has a tetragonal symmetry (D3d) and corresponds to an octahedral coordination of the metal atoms. In the octahedral phase, conventionally referred to as the 1T phase, one of the sulfur layer is shifted compared to the others resulting in an AbC stacking sequence. The filling of the d orbitals of the metal directly influences the atomic structure of the TMD layers. For the 1H phase, the d orbital splits into 3 degenerate states dz2, dx2-y2,xy and dxy,yz with an energy gap of ~1 eV between the dz2 and dx2-y2-xy orbitals. For the tetragonal symmetry of the 1T phase, the d orbitals of the metal degenerate into dxy,yz,zx (t2g) and dx2-y2,z2 (eg) orbitals. Up to 6 electrons can fill the e2g orbital. Since the p orbitals of chalcogens are located at much lower energy than the Fermi level, only the filling of the d orbitals determines the nature of phases in MX2 compounds. Completely filled orbitals give rise to semiconducting behavior while partial filling induces metallic behavior."

Bhattacharyya etal. (5) teach the strain engineering of dichalcogenides: "The applied NC" (normal compressive) "strain leads to S-M" (semiconducting to metallic) "transition for all the multilayers and bulk $MoS_2$. The band gap reduces smoothly and becomes zero at a threshold strain." "The change in the electronic structure under the application of strain was analyzed for each multilayer . . . ." "With the increase in normal compression, the degenerate bands begin to split . . . . The splitting is observed to be more prevalent in the valence band (VB) as compared to the conduction band (CB). The VB as well as the CB start to move towards the Fermi level with strain, reducing the band gap smoothly . . . . An S-M transition occurs when the VB crosses the Fermi level . . . ."

Scientists teach that 1T $MoS_2$ is unstable and metastable, and reverses spontaneously to non 1T phases.

In our workshop we demonstrated that the buried portion of the flake was converted to metallic conductivity, while the protruding portion of the flake remained semiconductive conductivity, thus forming a strain engineered heterojunction. The laser doping made the protruding portion of the flake more n-type. We also demonstrated that our construction permanently locks the differing phases of the flake, so the heterojunction was stable.

UV resins exert compressive stain on materials contained within them due to a reduction in volume when exposed to UV light. The UV light radically cleaves the photo initiator molecules present in the resin mixture which initiates polymerization and increases crosslinking density. This causes an increase in polymer density through the forming of complex matrices within the coating. When a material is contained within the resin during the curing process a compressive strain causes the material to shrink and be compressed. In some embodiments, there is an attractive force that binds the resin to the material being compressed. This attractive force could be bonds, electrostatic attractions or as simple as Van der Waals forces. This compression can alter material characteristics through molecular geometry shifts, leading to smaller band gaps, differing conductive properties as well as other novel effects. The resin molecules themselves do not shrink, however the polymerization and cross linking draw these molecules closer together and create an increased crosslink density.

During our development of these novel embodiments, we observed that during ultraviolet curing, that the conductivity of the buried flakes changed from semiconductive to metallic. Also, during our development of these novel embodiments, we observed that the metallic conductivity of the buried flakes maintained for months after the ultraviolet curing, with virtually no change in the conductivity of the buried flakes. We concluded that the ultraviolet curing monomers mutually compressed the buried $MoS_2$ flakes, as the monomers polymerized, and changed from long-distance connections to short covalent bonds. Bond lengths between the sulfur atom and the molybdenum atom are elongated as a result of compressive force from the resins shrinking during polymerization. The elongation of the crystal lattice allows the valence band and the conduction band to become much closer in energy, thus allowing for much easier charge transfer when compared to the valence-conduction band energy gap in a semiconductor. The band gap must be sufficiently small enough that electrons can freely jump in energy level and create effective conductive charge transfer.

The compression of the flakes shifts the crystal lattice of the $MoS_2$ from rhomboidal 2H geometry exhibiting semiconductive nature, to the lattice geometry of 1T octahedral. Said geometry change aligning the valence and conduction band so that the flake exhibits metallic characteristics. This creates a smaller band gap, thus giving the electrons higher mobility between the two bands resulting in higher conductivity.

Other non-limiting methods apply compressive strain to buried dichalcogenide flakes, such as the capillary forces developed during the evaporation of water from a mixture, solvent induced shrinkage, curing under pressure of an epoxy like SU8, and heat shrinkage (e.g. "shrinky dink" polystyrene.)

Some acrylate resins are known to shrink during polymerization, to reduce the actual coating volume of the acrylate reins. In some embodiments, the dielectric resin is comprised of acrylate resins and other materials that densely crosslink, with bonds that shorten during polymerization. In some embodiments, the acrylate resins and polymerization initiators polymerize with exposure to ultraviolet radiation, or near visible lightradiation, or visible light radiation. Some non-limiting examples of acrylate resins which shrink during curing are TMPTA (Trimethylolpropane triacrylate), HDDA (1,6-hexanediol diacrylate), and 2-PEOA (2-Phenoxyethyl Acrylate). In some embodiments the resins are cured using electron beam radiation or ultrasonic radiation or high frequency radiation.

In some embodiments, a portion of the dichalcogenide flake is buried in the dielectric resin, and the remainder of the dichalcogenide flake protrudes from the coating. The dielectric resin surrounds the dichalcogenide flake, and contacts the many corners, facets, planes and edges of the random dichalcogenide flake shape. The dielectric resin has chemical bonds to the dichalcogenide flakes. As the bonds of the dielectric resin shorten and the resin shrinks and reduces in volume, the resin conincidentally applies compressive strain to the many corners, facets, planes, and edges of the buried portions of the dichalcogenide flakes, causing strain upon the dichalcogenide flakes.

In some embodiments, the dielectric resin includes adhesion promoters which promote the bonding between the dielectric resin and the dichalcogenide flakes. In some embodiments, these adhesion promoters occupy available sulfur vacancies, and likewise bond to the ingredients of the dielectric layer.

This compressive strain upon the buried portion of the dichalcogenide flake converts the buried portion of the flake from semiconducting to metallic conductivity.

Zhang etal. Teach: "the high frequencies used for Wi-Fi communications have remained elusive to radio frequency harvesters (that is, rectennas) made of flexible semiconductors owing to their limited transport properties." Zhang etal. describe some of the shortcomings of prior art, such that "However, in such a structure, the top and bottom electrodes of the diode inevitably form a parallel-plate capacitor with large parasitic capacitance, which considerably hinders its high-speed applications." Further they teach that "$MoS_2$ is an emerging two dimensional (2D) semiconductor with high mechanical robustness and low-cost large-scale synthesis technology. By patterning $MoS_2$ into a metallic-semiconducting (1T/1T'-2H) phase heterostructure, we demonstrate a lateral Schottky diode with junction capacitance lower than 10 fF. In combination with a reduction in series resistance through self-aligned phase engineering, our $MoS_2$-based Schottky diode exhibits a cutoff frequency of 10 GHz (without de-embedding). This device is, to our knowledge, the first flexible rectifier with a cutoff frequency in the X-band, and it fully covers the global-satellite-positioning band (1.58 GHz and 1.22 GHz), the cellular-communications fourth-generation (4G) long-term-evolution band (1.7 GHz and 1.9 GHz), Bluetooth (2.4 GHz), the Wi-Fi channels (2.4 GHz and 5.9 GHz)8 and even the next-generation (5G) radio system. Moreover, with an intrinsic current responsivity of up to 4.7 A W-1, the performance of our 2D $MoS_2$ rectifier is comparable to that of rigid silicon-based Schottky diodes. By integrating this ultra fast flexible $MoS_2$-based rectifier with a flexible Wi-Fi-band antenna, we demonstrate a fully flexible and integrated Wi-Fi-band (5.9 GHz) rectenna that can directly harvest Wi-Fi-band radiation with zero external bias (battery-free)."

Further, Zhang etal teach "A rectenna is a passive electronic device that directly converts an incident electromagnetic wave into direct current (d.c.) and can provide power to a load connected to its output. A particularly important figure of merit of high-frequency Schottky diodes is their cutoff frequency, fc, above which rectification is inefficient8 an MoS$_2$ semiconducting-metallic (2H-1T/1T') phase junction that enables the creation of a lateral Schottky diode with ultra low RC time constant . . . ." Zhang etal. summarize "By integrating it with a flexible Wi-Fi-band antenna, we successfully demonstrated a fully flexible and integrated battery-free rectenna that can wirelessly harvest electromagnetic radiation in the Wi-Fi band. This work represents a key milestone for building a high speed flexible platform that can be promising for wirelessly charging future ubiquitous electronics using the existing Wi-Fi infrastructure as an energy hot spot."

In some of these embodiments we describe a heterojunction that bridges the gap between the anode and the cathode. We have described the gap between the anode and cathode as having a thickness of between 100 nanometers and 5 microns. This gap avoids the parasitic capacitance taught by Zhang etal.

Layered Composite Heterojunctions

Combining graphene and individual layers of other 2D materials (e.g. TMD monolayers) leads to a whole new class of materials, known as P-N heterostructures. These heterostructures feature tunable and tightly controlled electronic and optical properties. Here, we again highlight MoS$_2$, which is said to form an ideal heterojunction composite when combined with graphene in P-N heterostructures, because of the superb optical properties of MoS$_2$ and the high carrier mobility and optical transparency of graphene. MoS$_2$ and MoS$_2$-based-graphene hybrid heterostructures fabricated using other 2D materials were shown to be highly promising for use in flexible, low-power, transparent electronics and optoelectronics (e.g., diodes, rectifying diodes, photo detectors, solar cells, electrodes for batteries, and electrodes for supercapacitors). The semiconducting particles are selected from the group of semiconductors with flake shape: 2D Dichalcogenides like MoS$_2$, WS$_2$, MoSe$_2$, WSe$_2$; Semiconducting Dichalcogendies: MoTe$_2$, WTe$_2$, ZrS$_2$, ZrSe$_2$ Metallic Dichalcogenides: NbSe$_2$, NbS$_2$, TaS$_2$, TiS$_2$, NiSe$_2$; and Layered Semiconductors: GaSe, GaTe, InSe, B$_2$, Se$_3$.

The graphene and graphene like materials are chosen from the group comprising graphene, graphene oxide, black phosphorous, hexagonal boron nitride, and white phosphorous.

As a side note, a p-n junction forms at the interface between p-type and n-type type semiconductor materials, within a single semiconductor crystal, and current can flow through a p-n junction only in one direction.

MoS$_2$-Graphene composite heterostructures function as tunable Schottky-Barriers. The height of their Schottky-Barrier can be tuned by varying the doping of the MoS$_2$ portion and/or the Graphene portion. A Schottky-Barrier forms at a junction between a metal (Graphene) and a semiconductor (MoS$_2$), and presents a potential energy barrier for electrons. The barrier exhibits rectifying behavior, which is used, e.g., in diodes.

(6) teaches a method for exfoliation of the metal chalcogenide semiconductor ZnIn$_2$S$_4$ in pure water and preparation of heterostructures via "successive electrostatic coupling with another transition metal chalcogenide" (e.g., MoSe$_2$) to form a composite. This approach enables scalable preparation of composite P-N heterostructures and control over their thickness and composition, while lattice mismatch in produced heterostructures often does not deter from the functional characteristics of the new composite. Efficient charge transfer in the produced P-N heterostructures was confirmed by observing photoluminescence quenching and a marked reduction in emission lifetime. (11) teaches that electrostatic self-assembly of negatively charged ZnIn$_2$S$_4$ layers and positively charged MoSe$_2$ layers avoids lattice mismatch completely. In addition, this method provides strong coupling between the constituting layers thereby promoting efficient charge transfer through the interface with no dangling bonds Layered dichalcogenides can be used as hosts to various foreign impurities or dopants, which gives rise to many different nanocomposites. Doping markedly alters the properties of the host matrix, and cause the host dichalcogenide to carry a considerable positive potential or negative potential, depending on the parental material, and, in solutions, such doped dichalcogenides represent polycations and polyanions, respectively. Combining colloidal oppositely charged dichalcogenide flakes results in their (electrostatic) self-assembly in solution, adsorbing the p-type graphene flake to an n-type dichalcogenide, which effectively produces heterostructures or inorganic sandwich layered materials Sophisticated functionalities or nanodevices may be designed through the selection of nanosheets and combining materials and precise control over their arrangements at a molecular scale.

Fabrication of large-area patterned and functionalized surfaces like solar cells cannot rely on the deposition of individual dichalcogenide flakes measuring less than 5 microns in length, as this "does not prove suitable due to low yield and extremely slow fabrication speed"[6]. Many printing techniques are also not adequate.

Externally applied electric fields can greatly facilitate and guide self-assembly of different particles, because the electrostatic force can be accurately controlled, electric fields penetrate liquid and solid phases alike, and the sign of an applied electric field can be switched readily.

Self-assembly based on electrostatic attraction between oppositely charged particles (or flakes) and/or guided by an externally applied electric field yield high-quality P-N heterostructures, and techniques based on this electrostatic attraction would be inexpensive and scalable. Additionally, electrostatic attraction between localized surface-confined charges and particles (or exfoliated nanosheets) in solution can give rise to predefined patterned deposition[6], i.e., "localized surface charges may serve as templates for particle assembly, or as nucleation or reaction sites, allowing molecules to deposit in a predefined pattern."

Localized surface charges can be created by different techniques such as conductive stamps and focused ion or electron beams or by mixed monolayers, which can also be used to create surface charge heterogeneity. Electrostatic attraction also applies to uncharged suspended particles, both conductive and dielectric alike. The use of suspensions and emulsions in particle deposition from the liquid phase was explored[15] and its benefits were demonstrated. However, the stability of surface charges is sometimes an issue in electrostatic assembly. Surface charges are sometimes unstable in aqueous environments, but much more stable in nonpolar solvents such as hydro- and fluorocarbon oils, because of the higher resistivity of these solvents[13].

Due to their low dielectric permittivity, non polar liquids are typically poor solvents for ionic solids, because the electrostatic interaction between ions in such media is considerably stronger than in polar solvents, and the energy of electrostatic attraction between oppositely charged ions can be notably higher than the ion solvation energy. In non polar solvents, the Debye length of charged species, a characteristic distance at which the electric field of a charged particle or ion falls by a factor of e, is larger than in polar solvents, i.e., the electric field of each ion extends far in the medium. Put differently, the screening effect of the non polar solvent is sometimes very weak, and, therefore, without adding stabilizing agents such as surfactants, dispersants, or emulsifiers; only dilute solutions dispersions can be obtained in non polar solvents.

Emulsions are heterogeneous systems of two or more immiscible liquids. One of these liquids forms a continuous phase in which the other liquid component is dispersed in the form of droplets (the dispersed phase). Emulsions can be broadly categorized into two types: oil-in-water (O/W) (or direct emulsion) and water-in-oil.

W/O, Water-in-Oil (or Reverse Emulsion).

Generally, emulsions lack thermodynamic stability, but they can be stabilized by adding appropriate stabilizing agents, which gives rise to microemulsions. The latter are ternary systems consisting of the oil and water phases and a surfactant. In such systems, the droplet size of dispersed phase varies from 0.5 to 100 nanometers, but typically fall in the range of 10 to 50 nanometers.

Colloidal dispersions of $MoS_2$ and $WS_2$ flake shape-nanosheets can be prepared without the use of surfactants in some mixtures, since these dichalcogenides carry inherent electric charges. The stability of such colloids is due to electrostatic repulsion between nanosheets carrying like charges, which prevents their direct contact and self-flocculation. $MoS_2$, $WS_2$, and Graphene all have negative Zeta-potentials.

In some embodiments, the liquid is chosen from liquids comprising one or more non-polar organic solvents, one or more polar organic solvents, one or more polar organic solvents and water, or water.

Self Assembly with Coated Ink Emulsion

Electrostatic assembly enables self-assembly of different charged particles into more complex structures. In electrostatic assembly, as the name suggests, particles are attracted by electrostatic forces acting between oppositely charged particles. While self-assembly occurs quickly, in order for the newly assembled composite particles to remain in solution, the new composite particle must have a sufficient Zeta potential. For instance, alumina microspheres and silica nanospheres in aqueous solutions were reported to bear negative and positive surface charges, respectively, but these were below the indicated threshold. To overcome this, the particles were coated with alternating layers of polyanions and polycations until their zeta potential was sufficient, which resulted in their remaining dispersed in the liquid after self-assembly.[16]

In a similar vein charges on colloidal particles with acid/base functionalities at the surface can be manipulated by varying the pH value. In some embodiments a low pH value enables a high Zeta potential and enables the particle to remain in solution, whereas a higher pH value alters the Zeta potential and the particle can precipitate out of solution.

Two dimensional (2D) materials beyond graphene offer many possibilities for materials design. Indeed, the different nature of parental bulk materials, layer thickness, and stacking sequence suggest countless combinations. As mentioned above, with layered composite P-N heterojunctions, lattice matching is not relevant, because layered 2D materials do not have dangling bonds and usually many fewer charge trap states.

In combining different semiconducting materials together into composites, we take into consideration their electronic structure, i.e., the band structure and the work function, the majority charge carrier (holes or electrons), and whether they have direct or indirect band gaps.

In some embodiments, the p-n junction is formed by doping portions of a single semiconductor crystal with different dopants. In some embodiments of layered composite P-N heterostructures the conduction type can be manipulated by chemical doping the individual dichalcogenide layers with dopants, and then, in fabricating a composite heterojunction device, layers with different majority charge carriers can be combined directly. Besides doping the majority carriers ability, the constituents can be doped to change their Zeta-potential.

Emulsion printing inks are commonly comprised of water and nonpolar solvent (or low polarity solvent) and surfactant, forming an emulsion. In Oil in Water emulsions aka O/W (or direct) emulsions, the dispersed phase is lyophilic, and droplets of the lyophilic phase can serve as containers for particles carrying a surface charge. In this way, a direct contact between charged particles and aqueous media can be avoided and thus the charge on the particles is preserved.

Charges on surfaces and suspended particles are more stable in nonpolar media (e.g. hydrocarbon solvents and fluorocarbon solvents). However in water or aqueous solutions or polar solvents, the surface charge is rapidly lost. The charge stability is important for the stability of colloidal systems in general, including electrostatic self-assembly, and electric field-guided assembly. The mechanism of charge stabilization in nonpolar media has not been fully understood yet and is a topic of debates, but it seems that inherently high resistivity of nonpolar solvents plays a major role. The presence of impurities and even trace amounts of water may have a significant impact on the conductivity and the stability of ionic species in nonpolar solvents or the stability of the surface charge. Water may readily adsorb on suspended particles, resulting in ionization of their surface groups, which creates surface charge. According to one generally accepted model, organization of electrical charges into larger structures (e.g., micelles or complex macroions) prevents them from being neutralized. Although particles dispersed in nonpolar solvents can have considerable surface potential, the electrostatic repulsion between them is generally weak and long-ranged, and the screening length is more than an order of magnitude larger than in aqueous media, meaning that double layers of two particles with similar charges sometimes readily overlap. Long-ranged interactions between particles in non polar dispersions is the result of the small permittivity of the non polar solvent and very low ionic strength of the particles.

Applying an emulsion on a surface is not trivial, as many factors affect the final result. For instance, concentrated surfactant-stabilized O/W emulsions, when applied on a hydrophilic glass surface, may undergo phase separation or inversion depending on the speed of application. With oil droplets functioning as particle vehicles within an aqueous medium, the conditions favoring adhesion and spreading of oil droplets on a substrate (hydrophilic or hydrophobic) is a desired outcome. Smaller lyophilic droplets may actually exhibit diminished ability to adhere to, and stay on, a substrate, and this can have a negative impact on surface patterning, for which smaller droplets provide better spatial resolution. In addition to hydrodynamic conditions, the chemistry of an emulsion—the nature, charge, and concentration of surfactant, nature of the oil phase, the presence and concentration of an added electrolyte—and physicochemical properties of the surface (hydrophilic/hydrophobic) are important variables in this process as well.

Consider a substrate with a hydrophilic coating or hydrophilic surface such a glass surface treated in a NaOH solution followed by plasma cleaning. Hydrophobic particles with surface charge are deposited on the substrate by e.g., drop casting, spin-coating, or dip-coating. The particles may have inherent surface charge (few-layer $MoS_2$); or their surface charges can be a result of surface treatment, adsorption/anchoring of molecules with ionizable groups, or polymer modification. The substrate with attached particles is immersed in an O/W emulsion or the emulsion is spread on the substrate. Droplets of the oil phase contain suspended particles (or ions) that have a charge opposite to that of the particles resting on the substrate. To be specific, the oil droplets can carry negative electrical potential multiwall CNTs (carbon nanotubes), and positive electrical potential graphene flakes are fixed to the substrate, and the goal is to prepare surface-bound graphene-CNT composites. Of course, due to Brownian motion, oil droplets containing CNTs will impact the surface and the graphene flakes, but this process will be more controllable and directional if the oil droplets carry a surface charge opposite to that of attached particles. This can be achieved by choosing a polymer (polyelectrolyte) and/or surfactant that adsorbs at the oil/water interface and imparts the required surface charge to it. Adsorption of an ionic surfactant will bring the oil droplets to the required charge (positive or negative), but the surfactant alone may not be able to stabilize the emulsion. In the presence of polyelectrolytes or hydrophilic polymers, along with the surfactant, the emulsion can be much made more stable due to formation of polyelectrolyte-surfactant complexes around oil phase droplets. Given that in the considered example the graphene flakes are positively charged, hexadecyl amine can be chosen and an cationic oil-soluble surfactant (its hydrophobic tail will be inside the oil phase while the protonated amine group will be facing the aqueous phase) and high-molecular-weight poly(acrylic acid) as negatively charged water-soluble polymer. With surfactant and hydrophilic polymer molecules having acid/base functionalities, the pH of aqueous face is a factor affecting the behavior of these molecules in the context of emulsion stabilization and oil droplet charging.

Suppose that the emulsion was successfully spread on the substrate. Heating the substrate causes the oil phase to evaporate first due to its greater volatility (higher vapor pressure) than that of the water. As the oil phase surrounding the assembled particles evaporates and recedes, the surface tension of the water phase causes the water solution to flow and surround the assembled particles. As the bulk of the water phase evaporates, the hydrophilic polymer coalesces and traps the assembled particles, adhering the assembled particles to the already coated substrate.

TMD (Transitional Metal Dichalcogenides) have an electric charge on their surfaces. Few-layer $MoS_2$ flakes resting on a silicon substrate under ambient conditions were found to have a uniform surface potential, except for edges and folds, where the potential was smaller. $MoS_2$ flakes exfoliated in aqueous ethanol by sonication had a substantial zeta potential. Solvent exfoliation of ammoniated $MoS_2$ and $WS_2$ produced stable suspensions, suggesting that the dispersed nanosheets had surface charges. The Zeta potential of TMD nanosheets can be manipulated by conducting exfoliation in the presence of surfactants or macro-molecules that adsorb on to the nanosheet surfaces. Likewise the zeta potential can be manipulated by adding surfactants or macro-molecules to formed TMD suspensions.

In our workshop we have manipulated Graphene by doping so that the Zeta potential of graphene is changed from (−) to (+), and the exfoliated graphene remains in neat dispersion in both aqueous and mixed aqueous/alcohol solutions. Further we added exfoliated $MoS_2$ flakes to the solutions, and the graphene flakes with (+ zeta potential) were spontaneously electrostatically attracted and bonded to the $MoS_2$ flakes with (− zeta potential), to form layered composite P-N heterojunctions comprised of a graphene layer flake bonded to a $MoS_2$ layer flake. The assembled composite particles did not fall out of the liquid solution, so the electrostatic assembling of the flakes was not unlimited to continuous assembly of (+)(−)(+) . . . and so on flakes, but rather further assembly was hindered. Had the flakes continued with unhindered assembly, the heavier assembled particles would have dropped out of solution.

The dichalcogenide nanosheet edges have less charge than the flat basal surfaces of the few layer thick dichalcogenide flake. Therefore the oppositely charged nanosheets self assemble with the surface of one nanosheet electrostatically bonding to the oppositely charged surface of the other sheet, with little coupling of the flakes to the much lower charged edges of any given flake.

These layered composite P-N heterojunctions comprised of one positively charged flake and another negatively charged flake can be manipulated in an electrical field created by oppositely charged electrodes or electrets. For example, in a composite particle, the positively doped graphene layer is attracted to a negatively charged electrode, and likewise the negatively charged $MoS_2$ layer is attracted to a positively charged electrode. In some embodiments, the electrical sign electrical pole of these electrodes is temporary, and once the diode is completed, the circuit driving the diode can change the polarity of the electrodes. In some embodiments, the flakes are deposited into a resin covered plate inserted betwixt the positive electrode and the negative electrode, and poles of the layered composite P-N heterojunction are attracted to the electrode of the opposite charge. In some embodiments, one electrode is the cathode, and the other electrode is an anode, and the flakes are assembled with their correct pole contacting the matching electrode. In some embodiments the resin is polymerized, and the resin forms a gel or stiff gel or a solid coating that fixes the layered composite P-N heterojunction in place.

To summarize, in our workshop we doped graphene flakes to have positive charges, and positive zeta potentials (+). We then mixed these graphene flakes with negatively charged $MoS_2$ flakes in solution, and the graphene flakes and the $MoS_2$ flakes quickly electrostaticly self assembled into layered composite P-N heterojunction particles. These newly assembled composite particles did not precipitate out of solution. And then we deposited these composite particles into a resin covered electrode plate, under the influence of an electrical field, so that these composite flakes oriented with the proper pole deposited into the resin coated corresponding plate, and the surface of the composite flakes contacts the electrode. Afterwards we polymerized the resin, and later deposited an electrode on top of the polymerized resin coating, forming a diode or a rectifying diode or a solar cell.

In some embodiments, to self assemble a 3 flake "sandwich" particle, two flakes with like charges may be attracted to a third oppositely charged flake (i.e. (+)(−)(+) or (−)(+)(−)), and the two flakes with similar charges would form the outer sides of the particle (the slices of bread for a sandwich), and the one flake with an opposite charge forms the interior of the 3 layer composite (the meat within the bread slices).

The 2 "basal" sides of the 3 flake sandwich will repel similarly charged flakes in solution, due to electrostatic repulsion. And the edges of the bread slices have much less charge. Given the basal repulsion, and that edges of the flakes are less charged, no other flakes in solution will attach to the periphery of the composite P-N heterojunction, or to the inner flake of the three flake sandwich.

In some embodiments, a solar cell can be assembled like an open face sandwich. Two flakes with opposite charges can self assemble, I. e. a slice of bread with meat on top, (+) slice attracted to (−) meat. A third flake can be deposed contacting the meat like a slice of bread for an open face sandwich. In some embodiments, the third flake (slice of bread) can have a potential opposite that of the meat, so that electrostatic attraction bonds the the third slice of bread to the meat, like: first bread slice (+) attracted to (−) meat, with a second bread slice (+) deposed nearby, attracted to a portion of the meat and contacting a portion of the meat, i.e.: (+) (−)/(+), forming an open face sandwich.

Broadly defined, surfactants adsorb at interfaces between a liquid and a solid or a gas phase, resulting in a considerable decrease in the surface tension. Surfactants can be categorized according to their chemical nature as anionic, cationic, nonionic, amphoteric, and weakly acidic and weakly basic surfactants, with the first four types essentially reflecting the charge state of surfactant molecules in solution.

Surfactants can also be classified as hydrophilic or hydrophobic, i.e., on the basis of their preferential solubility in aqueous or nonaqueous media. Ionic surfactants are typically hydrophilic, i.e. soluble in polar media, while the solubility of non-ionic surfactants is determined by their hydrophilic-lipophilic balance (HLB), one quantitative characteristic of surfactants. Surfactants can function as emulsifiers, dispersants, wetting agents, detergents, and other functions.

The properties of an emulsifying surfactant, also called an emulsifier, depend on a number of factors that are different for different systems. In particular, these are the chemical nature and composition of phases selected for an emulsion, and, additionally, the surfactant concentration may affect the type of resulting emulsion (O/W or W/O). The general factors identifying a surfactant as a good emulsifier for a particular system are as follows: (1) good surface activity, i.e., the ability to effectively reduce the surface tension at the interface between the two liquids; (2) formation of a film at the interface because of lateral interactions between parts preferentially soluble in the dispersed phase (hydrophobic parts in the oil phase of O/W emulsions) or in the water phase (hydrophilic parts in the water phase of W/O emulsions); (3) facile diffusion to the interface, so that the emulsifier molecules could reach the interface within the emulsification period.

Examples of natural emulsions are milk (O/W) and milk sap (O/W). Emulsions are encountered in many product groups, e.g., cosmetics (hair cream, lotions), food (mayonnaise (W/O), butter (W/O), ice cream), pharmaceuticals (creams, liniments), paints, and metal cutting oils.

A dispersant is a surface active chemical species that assists in breaking up a solid or a liquid into fine particles or drops, respectively, to form different colloidal systems: suspensions, emulsions, or aerosols. In the paint and coating industry, dispersants are used to break up a pigment and stabilize the resulting particles, providing affinity to wet the pigment surface and prevent particle aggregation.

Consider, by way of example, pigment dispersants. These can provide only electrostatic or both electrostatic and steric stabilization to dispersed particles. The former stabilization factor can be furnished using commodity polymers, which are affordable and ensure good dispersion stability, but may cause issues with pigment performance; while electrostatic stabilization is achieved with high-end dispersants, which are typically produced from specialty monomers and have lower molecular weight. Sometimes, a dispersant alone is not adequate to obtain a product with required physicochemical properties and performance, and additional components are added to cover for deficiencies associated with the use of the dispersant alone. These can be stabilizing surfactants (with a high and medium HLB value) and nonstabilizing surfactants (with a low HLB value). They stabilize viscosity, improve the quality of produced coatings, improve milling efficiency, or merely reduce interfacial tension (wetting agents).

Both emulsifiers and dispersants adsorb at the interfaces between two immiscible liquids or a liquid and a solid, respectively, thereby reducing the surface tension which considerably facilitates the breaking up of corresponding phase by subsequently applied mechanical forces and provides a certain degree of stability to resulting dispersion system.

Polyelectrolytes can be excellent dispersants for aqueous suspensions by imparting surface charge to suspended particles and providing a steric barrier, which preventing direct contact between particles. Polyelectrolytes—polyanions and polycations—are polymers with functional groups that dissociate in polar (aqueous) media to give polymeric molecules with multiple charges. The degree of dissociation can be high or low depending on the nature of dissociating groups, i.e., whether they behave like strong or weak electrolytes, respectively. In the latter case, the degree of dissociation is pH-dependent. Unlike homopolymers, copolymers exhibit better adsorption to a wider range of surfaces, i.e. they are more universal. Dispersions of non polar particles can be better stabilized with copolymers of long- and short-chain monomers, such as acrylic acid and lauryl methacrylate; while more hydrophilic polymers such as polydiallyldimethylammonium (PDDA) chloride and polysodium styrenesulfonate (PSS) are more adequate for particles with surface charges, such as silica. In particular, spherical silica particles were stabilized and rendered the required minimum surface charge by coating them alternately with layers of PDDA (polycation) and PSS (polyanion), until the zeta-potential was below 40 mV. For this, "the primary silica particles were immersed into the polyelectrolytes in the order of PDDA, PSS, PDDA, and PSS to induce a negative surface charge. As for the $Al_2O_3$ particles, the surface charge was prepared by immersion in PSS and PDDA in order to obtain a positive surface charge.[16] Electrostatic assembly of this two types of particles occurred spontaneously when their corresponding solutions were mixed together.

Electrical double layer is a ubiquitous phenomenon and occurs at perhaps any interface, because there is always an unequal distribution of electrical charges between the two phases. "One half of the total charge remains confined to the surface, while the other half is in the solution side (if the solution contains ionic species, these are called counterions) and can be either in close proximity to the interface or diffused in the solution to greater or lesser extent. Often, a fraction of counterions settles very close to the interface, and the electric potential between the surface and this layer of counterions falls rapidly and linearly; while thermal motion scatters the other fraction of counterions in the vicinity of the interface. The potential drop across the diffuse part varies gradually. Historically, the layer of fixed counterions is referred to as the Stern layer.

An electrical double layer forms at the interface of some electrodes of supercapacitors and electrodes for batteries. In some embodiments, an optimum electrode is constituted by a plurality of composite heterojunction particles, each particle comprised of a semicondcutive dichalcogenide flake layer and a metal or semi-metal flake layer like graphene.

Zeta potential is the quantity characterizing the electrical potential of a colloidal particle and is readily available for experimental determination. By definition, it is the potential at the plane of shear, and its position may not coincide with the Stern plane, i.e., the plane of shear is located within the diffuse part of the double layer and further away from the Stern plane (8).

The size of electrical double layer is characterized by the quantity known as Debye length. Its mathematical definition arises in the Gouy-Chapman model of electrical double layer. As was mentioned above, it shows the distance from the charged surface at which the electric potential falls by a factor of e (the base of natural logarithm). In simple (qualitative) terms, the Debye length increases directly with dielectric permittivity of the medium and inversely with the ionic strength of solution.

The stability of suspensions can be estimated on the basis of Derjaguin-Landau-Verwey-Overbeek (DVLO) theory developed late in the first half of the past century. The theory considers the balance between attractive and repulsive forces acting between colloidal particles. Attractive forces arise from van der Waals electrostatic interactions, and repulsive forces is the coulombic electrostatic repulsion between like-charges of the electrical double layers surrounding the particles. Irreversible self-flocculation does not occur, since the electrostatic repulsion between these particles is greater than the electrostatic attraction between them.

Ideal Stacked Dichalcogenides Schottky Solar Cell

The Schottky-type solar cell has a simple structure. To summarize and simplify, a Schottky-Barrier is formed at the contact region between a metallic electrode and a dichalcogenide, and it is important to use appropriate electrode pairs for the left and right electrodes (asymmetric electrodes).

In [9], the authors have investigated in detail the effects of various device structures (combination of left and right electrodes and the distance between each electrode) and dichalcogenide morphologies ("on substrate" or "suspended") on the photovoltaic features of the solar cell to obtain a better device performance.

By varying these factors the fabrication of Schottky-type solar cells with a few-layered dichalcogenide was achieved. The solar cells fabricated on a $SiO_2$ (silicon oxide) substrate demonstrated a high PCE (power conversion efficiency) of ~0.7%, which is the highest for solar cells with thin (below 3 Layer) dichalcogenides. In addition, the scalability of the method is also demonstrated through the fabrication of solar cells with few-layered $WS_2$ on a centimeter-scale $SiO_2$ and flexible substrate, where clear power generation is demonstrated.

It has been demonstrated that a relatively high-performance solar cell could be fabricated with few-layered $WSe_2$ and $WS_2$ by a simple Schottky-type configuration by using CVD-grown $WS_2$ instead of mechanically exfoliated $WSe_2$ and $WS_2$ to fabricate the large-scale TMD sample.

Schottky-Barrier solar cells represent a specific device geometry where van der Waals metal contacts could enable high performance in vertical stacked devices. Vertically stacked Schottky-junction dichalcogenide solar cells have been limited by ohmic current-voltage (I-V) behavior, low external quantum efficiencies, and low open-circuit voltages, likely due to Fermi-level pinning induced by contact evaporation. New gentle contact fabrication techniques have the potential to eliminate this Fermi-level pinning, enabling high-efficiency dichalcogenide solar cells in the Schottky-junction geometry. We claim solar cells wherein the metal layer and the semiconductive layer are oriented approximately normal to the substrate, not vertically stacked.

In [9] the authors describe a simple technique for transferring metal contacts, where all lithographic patterning is done on a donor substrate rather than on the active device. This technique is employed to build stacked Schottky-junction solar cells with multilayer dichalcogenide absorber layers.

Because of the trade-off between bandgap energy and photoluminescence quantum yield, the theoretical maximum power conversion efficiency achievable for multilayer and monolayer single junction solar cells is similar, and further, tunneling limits transport in monolayer vertically stacked devices.

In (9) ultra thin (10- to 20-nm) $WS_2$ forms the absorber layer, while Ag and Au form the asymmetric work function contacts. Devices made with transferred metal contacts show diode-like I-V behavior with a near-unity ideality factor and high $V_{OC}$, while similar devices made with evaporated metal contacts show ohmic I-V behavior and near-zero VOC. Peak external quantum efficiency (EQE) of >40% and peak active-layer internal quantum efficiency of >90% in transferred-contact devices was achieved. Device simulations of further-optimized geometries suggest that this new metal transfer process has the potential to enable Schottky-junction dichalcogenide solar cells with power conversion efficiencies greater than 8% and specific powers greater than 50 kW/kg (killowatts per kilogram).

This method allowed for batch fabrication, and eliminates aligned lithography. By applying this new technique to stacked Schottky-junction TMD solar cells, it was demonstrated that transferred contacts are particularly advantageous for vertical device geometries, which are important for photovoltaic and other optoelectronic applications due to their scalable active areas.

Characteristics of Graphene

Graphene is the ideal material to be used in Solar Cells due to its high conductive capacities, which are superior to those of copper. It has a transparent appearance and remarkable plastic qualities.

Graphene makes solar cells more efficient. Unlike the traditional indium tin oxide, graphene is also transparent to a certain portion of the infrared bands of sunlight, which accounts for about half of the solar radiation on Earth. Thus the electrodes made of graphene have a lot of advantages.

The basic principle of a graphene-based solar cell is essentially not that different from current inorganic/silicon solar cells being produced today, with the exception that some of the materials currently used are replaced with graphene derivatives. As with any device or material, there are parameters that can be improved to increase operational efficiency. Graphene excels in tune-ability and adaptability. For graphene-based solar cells, the two standout parameters that can potentially change the nature of the device are the number of graphene layers in the device (or in the individual components within a device) and the effects of doping a graphene-based material.

The relationship between optical transparency, sheet resistance, and the number of layers can be characterized by a proportional decrease in both the optical transparency and the sheet resistance, with an increasing number of graphene layers. A single layer of graphene shows an optical transparency of 97.7%.

A 3-layered graphene stack exhibits around 90.8% optical transparency and the addition of each layer corresponds to a 2.3% decrease in optical transparency. A single sheet of graphene produces a sheet resistance of 2.1 k$\Omega$sq$^{-1}$ and 350 sq$^{-1}$, while retaining 90% optical transparency. The quenching effect of multiple graphene layers can be up to 11% greater than monolayer graphene, due to a higher hole accepting density.

The doping of heteroatoms onto a sheet of graphene can significantly alter the chemical, physical, electronic and photonic properties of the sheet and is a common approach in many solar cells. There are two main types of doping—p-type and n-type. P-type doping utilizes trivalent atoms, such as boron, which extracts an electron off the graphene sheet and creates a hole, a process known as hole doping, where the hole is created in the valence band of the graphene sheet. Whereas, n-type doping involves pentavalent atoms, such as vanadium, and is an electron donating doping approach that facilitates a free electron from the pentavalent atom onto the graphene sheet. The free electron in this instance is facilitated in the conductance band of the graphene sheet. Doping a graphene sheet can occur through various methods, including through solid, liquid and gaseous phase chemical doping, ball milling, thermal annealing, in-situ doping during chemical vapor deposition (CVD) methods and plasma treatment, to name a few. The effect of doping varies depending on both the type of graphene derivative used and the doping process. Regardless of which of these parameters (or both) are utilized in the doping process, the general result is improved efficiency of the solar cell. Dichalcogenides like $MoS_2$ and $WS_2$ can also be doped. There are various types of Graphene based Solar Cells as mentioned below:

Graphene-Silicon Solar Cells

Graphene based films for solar cells can be produced with a predetermined thickness and complete coverage. It also allows the properties to be tuned, dependent upon the doping mixture used. Graphene has now been implemented into various junctions in graphene-silicon solar cells, including p-type heterojunctions, n-type heterojunctions and Schottky junctions. The Tuneability of Graphene is promising for Hybrid Solar Cells. Doping the graphene layers with gold particles has found to increase the efficiency by up to 40%.

Graphene Tandem Solar Cells

Tandem solar cells, otherwise known as multi junction solar cells, are composed of two or more sub-cells that are stacked together in either a series or parallel configuration. It has been predicted that a single solar cell can theoretically produce up to 40% solar energy conversion efficiency, but tandem solar cells have the potential to reach up to 86% efficiency. The PCE of many solar cells has been enhanced to date by employing tandem arrangements.

Graphene Bulk Heterojunction Solar Cells

Graphene's high electronic conductivity, transparency and flexibility make graphene useful in heterojunction solar cells, where they can be employed in many different ways including electrodes (both anodes and cathodes), acceptor layers, donor layers, buffer layers and active layers. The multi junction within the solar cell relies heavily on graphene's specific tunable parameters, including the thickness, thermal annealing temperature, the concentration of doping on the sheet and its photovoltaic performance.

Graphene heterojunction solar cells are by far the most widely studied and used graphene-based solar cell. There are many variations of heterojunction solar cells and how graphene derivatives can be incorporated into them, including as transparent electrode, photoactive layers and Gallium Arsenide (GaAs) solar cells. As such, graphene heterojunction solar cells cannot be generalized as a single class of solar cells.

Graphene Schottky Junction GaAS Solar Cells

GaAs solar cells have been one of the most widely studied type of heterojunction, namely Schottky junction, solar cells. Despite the large amount of research, only a few have reached PCE levels comparable to that of other heterojunctions and PSCs. However, the ones which have achieved high PCEs are some of the most efficient graphene-based solar cells. GaAs has a superior band-gap to silicon, with a charge carrier mobility that is six times higher. Theoretically, GaAs heterojunctions have the potential to produce efficient solar cells, but the devices currently being produced vary in quality.

One of the cells that is less favorable than it's high-flying counterparts is based around CVD-grown single and multi-layer graphene on n-type GaAs substrates, which only shows a PCE of 1.95% and an open circuit voltage of 0.65 V. Another such example is that of pillar-array-patterned silicon substrate with graphene, which only shows a PCE up to 1.96%. With nitric acid doping, the cell can achieve a PCE of up to 3.55%, but it's still lower than many other solar cells. By comparison, a Schottky junction solar cell made from CdS nanowires and graphene has only achieved a PCE of 1.65%, showing that there is a wide range in terms of quality, not only with GaAs solar cells, but with Schottky junction solar cells in general.

Of the higher achievers, one example is that of a solar cell composed of an n-type silicon and TFSA-doped (trifluoromethanesulfonic acid) graphene Schottky junction. The synthesis approach is simple and a PCE of up to 8.6% can be achieved, which is 4.5 times higher than that of its un-doped counterpart and 6 times greater than other GaAs solar cells. The doping of TFSA on these devices not only increases their performance, but also enhances the stability of the device, compared to an un-doped version, to both oxygen and moisture.

One of the better-quality GaAs solar cells is that of a cell which is composed of a GaAs substrate and graphene, with a silicon nitride (SiNx) insulating layer and silver 'fingers'. These solar cells have achieved much better efficiencies than many other solar cells, with PCEs varying between 10.4% and 15.5%. By optimizing the open circuit voltage, junction ideality factor, graphene resistance and the internal interfacial contact, there is a theoretical possibility to achieve a PCE of up to 25.8% with these solar cells.

P-N heterojunction Solar cells composed of graphene/semiconductor van der Waals Schottky diodes, with a tunable gate and Fermi level, lead the way in terms of efficiency. The heterojunction utilizes a graphene-dielectric-graphene gate to achieve a PCE of up to 18.5% much higher than other GaAs solar cells. The open circuit voltage, while not the best compared to other solar cell classes, is better than many other GaAs solar cells, with a value of 0.96 V. Aside from producing a highly efficient solar cell, there are theoretical predictions that the PCE of these cells could be increased to 23.8%

Effects of Doped Graphene in Solar Cells

The doping of heteroatoms onto a sheet of graphene can majorly alter the physical, chemical, photonic and electronic properties of the sheet and is a common approach in many solar cells. The two main types of doping are p-type and n-type. In some embodiments P-type doping uses trivalent atoms, such as boron, which extracts an electron off the graphene sheet and develops a hole, a process called hole doping, where the hole is produced in the valence band of the graphene sheet. Whereas, in some embodiments n-type doping involves pentavalent atoms, such as vanadium and is an electron donating doping approach that helps a free electron from the pentavalent atom onto the graphene sheet. In this instance, the free electron is facilitated in the conductance band of the graphene sheet. Doping a graphene sheet can take place via different methods, including through liquid, solid and gaseous phase chemical doping, thermal annealing, ball milling, in-situ doping during chemical vapor deposition (CVD) methods, laser doping, electron beam treatment and plasma treatment, to mention a few. The effect of doping differs based on both the doping process and the type of graphene derivative used. The general result is enhanced efficiency of the solar cell regardless of which of these parameters (or both) are utilized in the doping process.

Graphene and monolayer Transition Metal Dichalcogenides (TMDs) are promising materials for next-generation ultrathin optoelectronic devices. Although visually transparent, graphene is an excellent sunlight absorber, achieving 2.3% visible light absorbance in just 3.3 Å thickness.

Schottky-Barrier Solar Cell

A Schottky-Barrier solar cell, consists of a metal (thin, mostly transparent) at the surface followed by a semiconductor back contact. A heterojunction solar cell comprises an interface (junction) of two materials with opposite carrier types, which allows efficient carriers separation of the photo-generated electron-hole pairs at the interface with minimal recombination to induce the photovoltaic (PV) effect. Bernardi and co-workers have studied the PV effects of 2D heterojunction theoretically, including the Schottky-Barrier between $MoS_2$ and graphene and the $MoS_2/WS_2$ stacking heterostructure [10].

Bulk heterojunction structures based on carbon materials have attracted a great deal of interest for both scientific fundamentals and potential applications in various new optoelectronic devices e.g., photovoltaic solar cells. The earliest successful carbon-based semiconductor to partially replace silicon in the solar cell is diamond-like amorphous film. The successful formation of p-type a-C/n-type silicon (n-Si) junctions represented a first step toward further realizing practical carbon-based solar cell.

In [9], graphene sheets were deposited on n-Si wafer to make solar cells with efficiencies up to 1.5%. The authors demonstrate, GS films can be combined with Si to form Schottky junctions and efficient solar cells.

Characteristics of $WS_2$ $WS_2$ crystals from 2D semiconductors are known for its superior valleytronic performance, perfect crystallization, defect free structure, extremely narrow PL bandwidths, clean PL spectra (free of bound exciton shoulders), and high carrier mobility. $WS_2$ is another representative of the family of semiconducting TMDs. According to optical measurements, the single-layer form exhibits direct band gap of at least 2.0 eV Theoretical models predict that among the semiconducting 2D TMDs, $WS_2$ should have the highest mobility due to the reduced effective mass. $WS_2$ could also be very interesting because of the strong spin-orbit coupling induced valence band splitting which results in spin-valley coupling. While the valence band splitting for $MoS_2$ is ≈150 meV, because of the larger mass of W atoms, it is almost three times larger (≈426 meV) in $WS_2$, which would allow easier observation of the valley Hall effect than in $MoS_2$. The need for large-area deposition of TMDs resulted in interest in large-scale growth methods, including CVD growth of $WS_2$ in single-layer form.

Characteristics of $MOS_2$

Molybdenum disulfide belongs to a class of materials called 'Transition metal Dichalcogenides (TMDCs). Materials in this class have the chemical formula $MX_7$, where M is a transition metal atom (groups 4-12 in the periodic table) and X is a chalcogen (group 16). The chemical formula of molybdenum disulfide is $MoS_2$. The crystal structure of molybdenum disulfide ($MoS_2$) takes the form of a hexagonal plane of S atoms on either side of a hexagonal plane of Mo atoms. These triple planes stack on top of each other, with strong covalent bonds between the Mo and S atoms, but weak van der Waals forcing holding layers together. This allows them to be mechanically separated to form 2-dimensional sheets of $MoS_2$.

$MoS_2$ occurs naturally as the mineral 'molybdenite'. In its bulk form, it appears as a dark, shiny solid. The weak interlayer interactions allow triad sheets to easily slide over one another, so it is often used as a lubricant. It can also be used as an alternative to graphite in high-vacuum applications, but it does have a lower maximum operating temperature than graphite. Bulk $MoS_2$ is a semiconductor with an indirect bandgap of ~1.2 eV A single monolayer of $MoS_2$ can absorb 10% of incident light with energy above the bandgap. When compared to a bulk crystal, a 1000-fold increase in photoluminescence intensity is observed, but it remains relatively weak—with a photoluminescence quantum yield of about 0.4%. However, this can be dramatically increased (to over 95%) by removing defects that are responsible for non-radiative recombination. The bandgap can be tuned by introducing strain into the structure. A 300 meV increase in bandgap per 1% biaxial compressive strain applied to trilayer $MoS_2$ has been observed. The application of a vertical electric field has also been suggested as a method of reducing the bandgap in 2D TMDCs—potentially to zero, thereby switching the structure from semiconducting to metallic. Photoluminescence spectra of $MoS_2$ monolayers show two excitonic peaks: one at ~1.92 eV (the A exciton), and the other at ~2.08 eV (the B exciton). These are attributed to the valence band splitting at the K-point (in the Brillouin zone) due to spin-orbit coupling, allowing for two optically active transitions. The binding energy of the excitons is >5.00 meV Hence, they are stable up to high temperatures.

$MoS_2$ monolayers are flexible, and retain their electronic properties when bent to a 0.75 mm radius of curvature. They have a stiffness comparable to steel, and a higher breaking strength than flexible plastics (such as polyimide (PI) and polydimethylsiloxane (PDMS), making them particularly suitable for flexible electronics. At around 35 $Wm^{-1} K^{-1}$ the thermal conductivity of $MoS_2$ monolayers is ~100 times lower than that of graphene PEDOT:PSST (polythiophene and polystyrene sulfonate) is an intrinsically conductive polymer (ICP) that can be coated on various substrates and nanostructures like fullerenes to form a composite with high electrochemical properties for applications like low cost printed electronics, optoelectronics and polymeric solar cells.

Bulk Heterojunction Configuration

The advantage of the BHJ configuration is the increase of the donor/acceptor interface area, so that most of the excitons could reach the heterojunction interface within exciton diffusion length, which is beneficial to improving the exciton separation efficiency. However, a critical issue for bulk heterojunction PSCs (photovoltaic solar cells) is that the physical blending of donor and acceptor materials could result in macrophase separation. The domain sizes of donor or acceptor phase could exceed the exciton diffusion length (ca. 10 nanometers), and there could exist randomly distributed floating islands or dead ends (donor or acceptor domains that are isolated and not connected to the electrodes) in the active layer, which hinder the separated charge from transporting to the respective electrodes. Therefore, the electrons generated near the anode and the holes generated near the cathode could not transport to the corresponding electrodes to be efficiently collected, which leads to increased charge recombination and reduced current. One approach to overcome this drawback is to construct ordered BHJ films, which would enhance the charge transport and collection. Unfortunately, it is difficult to demonstrate such a structure in the BHJ system. On the contrary, in conventional planar solar cells, electrons and holes have their own respective transport channel; therefore, the carrier collection efficiency on the electrodes of the planar devices is much higher than that of BHJ devices.

The implementation of planar and bulk integrated heterojunction offers many advantages over the single planar and bulk heterojunctions, i.e., (1) A spatially continuous pathway for the transport of charge carriers to their corresponding electrodes, thus charge recombination at the electrodes can be reduced; (2) an extra donor/acceptor interface which could increase the probability of exciton dissociation; (3) The absorbing layer thickness can be optimized to achieve better quantum efficiency; (4) It is possible to tune the internal distribution of the electrical field within the different layers.

Bulk-heterojunction organic photovoltaic (BHJ-OPV) technology promises high efficiency at ultra low cost and weight, with potential for nontraditional applications such as building-integrated photovoltaic (PV). There is a widespread presumption that the complexity of morphology makes carrier transport in OPV (organic photovoltaic) irreducibly complicated and, possibly, beyond predictive modeling. A bulk-heterojunction organic photovoltaic (BHJ-OPV) solar cell consists of two demixed, phase-segregated, bicontinuous, donor-acceptor organic semiconductors capped by a transparent anode and a metallic cathode.

Two-dimensional (2D) semiconductor materials have shown significant potential for application in optoelectronic conversion devices due to their unique physical properties. Introduction of 2D materials, such as $WS_2$ or $MoS_2$, into perovskite solar cells and organic solar cells can significantly affect the exciton binding energy via modulation of the built-in field across photovoltaic layers.

Excitonic solar cells have attracted a broad interest in recent years due to their potential to provide an excellent alternative to conventional Si-based photovoltaic cells.

The ability to control the size of the electronic bandgap is an integral part of solid-state technology. Atomically thin two-dimensional crystals offer a new approach for tuning the energies of the electronic states based on the unusual strength of the Coulomb interaction in these materials and its environmental sensitivity. By engineering the surrounding dielectric environment, one can tune the electronic bandgap and the exciton binding energy in monolayers of $WS_2$ and $Wse_2$ by hundreds of meV.

The Graphene/$MoS_2$/Silicone 3 Layer Heterojunction Solar Cell with Schottky-Barrier Ma etal. (12) teach a layered, stacked solar cell structure: graphene/$MoS_2$/Silicone heterojunction solar cell with a Schottky-Barrier, laboratory crafted on a silicone wafer. They teach "The inserted $MoS_2$ layers function as hole transport layer to facilitate the separation of electron-hole pairs as well as electron blocking layer to suppress the recombination at graphene/silicon interfaces." "The photogenerated electrons in the silicon have reduced transfer to the graphene electrode (and to recombine with the holes) due to the $MoS_2$ electron barrier." "We hypothesize that $MoS_2$ efficiently passivates the silicon surface, thereby reducing the number of interface trap states and making the device more ideal (the diode quality factor n closes to 1). The $MoS_2$ interlayer considerably minimized the recombination rate at graphene/Si interface, and consequently a lower current in the positive voltage region as well as a lower n value . . . ." "The Ebi can effectively facilitate the separation of photo-excitation electron-hole pairs, transporting separated electrons towards n-Si, and holes towards graphene. In fact, this Ebi was determined by the energy differences between the work function of graphene ($\Phi G$) and the electron affinity of n-Si ($\chi Si$). When the $MoS_2$ monolayer was inserted into the graphene/Si interface, the Ebi of the graphene/$MoS_2$/Si solar cell was enhanced due to band alignment between $MoS_2$ and n-Si. The up-shift tendency happened at the bottom of the conduction band as well as the top of the valence band. It is obvious that the Ec position of $MoS_2$ is much higher than that of n-Si, which will efficiently prevent electrons from transferring from n-Si to graphene, thus leading to minimize recombination on the graphene anode side. On the other hand, the fast holes transport happens in $MoS_2$ layers via a tunneling process. Therefore, we conclude that the $MoS_2$ interlayer can not only serve as hole transport layer to facilitate the separation of electron-hole pairs, but also act as electron blocking layer to suppress the recombination at interfaces in the graphene/$MoS_2$/Si Schottky-Barrier solar cell. However, further increase of the $MoS_2$ interlayer thickness to 20 nm results in the obvious degradation of the PV performance. The following reasons might be responsible for this degradation: (i) the $MoS_2$ interlayer has strong lightmatter interaction and high absorption coefficient. Thick $MoS_2$ interlayer will absorb additional photons and reduce the light harvested by n-Si. (ii) The reduction of band gap in thicker $MoS_2$ interlayer degrades the electron barrier at interfaces and consequently decreases the Vocand FF."

Shi etal. (13) teach a similar solar cell structure: Graphene/small Schottky-Barrier $MoS_2$ large P/large N Silicone solar cell. Further, they teach "A small Schottky-Barrier was formed between the few-layer graphene and $MoS_2$ layer due to the difference in their work function, and a large pn barrier was formed between $MoS_2$ and Si, accelerated the separation of the photogenerated electron-hole pairs and enhanced the carrier collection capability . . . ." "The structure of the studied graphene/$MoS_2$/p-Si was composed of a graphene layer, a $MoS_2$ layer, a p-Si layer, and Ni, Al electrodes . . . " "A Schottky-Barrier forms between the graphene and $MoS_2$ film, and a pn heterostructure forms between the $MoS_2$ film and Si substrate. Since the graphene layer has high transmission properties, only a small part of the light will be absorbed by the few-layer graphene, while a large part will pass through. The transmitted light is further absorbed by the $MoS_2$ film and Si substrate, which produces intrinsic absorption when the photon energy is larger than the optical band gap, giving rise to photogenerated electron-hole pairs. The holes, being the minority carrier in the $MoS_2$ layer, have a concentration gradient, which will diffuse to the space-charge region boundary of $MoS_2$/Si space-charge region. Thus, the photogenerated electrons and holes are separated by the built-in photovoltaic effect between the $MoS_2$ and Si surface." " . . . . The conversion of optical energy into electrical energy of the graphene/$MoS_2$/Si device is approximately 2.5%. It is larger than the previously reported values of 2.15% and 1.47% for a monolayer graphene film/Si-nanowire-array Schottky junction solar cell and graphene nanoribbon/multiple-silicon nanowires junctions, respectively. Moreover, it is almost ten times larger than that of the $MoS_2$/$WSe_2$ and the $WSe_2$/$MoSe_2$ Heterostructures. The high conversion efficiency . . . may be attributed to the following reason. Firstly, electrons in the graphene layer have high mobility, which imparts good conductivity and low contact resistance. Secondly, the double junctions can accelerate the separation process of the photogenerated electrons and holes, thereby decreasing their recombination. Finally, the bulk Si substrate has high carrier collection capability, which can effectively enhance the conversion efficiency."

"A Schottky-Barrier forms between the graphene and $MoS_2$ film, and a pn heterostructure forms between the $MoS_2$ film and Si substrate. Since the graphene layer has high transmission properties, only a small part of the light will be absorbed by the few-layer graphene, while a large part will pass through. The transmitted light is further absorbed by the $MoS_2$ film and Si substrate, which produces intrinsic absorption when the photon energy is larger than the optical band gap, giving rise to photogenerated electron-hole pairs. The holes, being the minority carrier in the $MoS_2$ layer, have a concentration gradient, which will diffuse to the space-charge region boundary of $MoS_2$/Si heterojunction."

Similarly Shanmugam etal. teach (14) "In conventional bulk or thin-film semiconductors such as Si and GaAs, the surface is not self-terminated. Since the lattice periodicity is interrupted, the surface possesses a huge density of unsaturated dangling bonds which act as recombination centers limiting solar cell performance. The surface recombination velocity of photo-generated carriers is greatly influenced by the surface traps, resulting in a key recombination process. 2D layered semiconductors, by nature, are individual atomic planes coupled via weak van der Waals forces. The surface is a self-terminated atomic plane with no dangling bonds. Therefore, in principle the surface recombination velocity is expected to be extremely low, as compared to conventional bulk and thin-film semiconductors. The low surface recombination velocity helps in facilitating an efficient photogenerated carrier collection at the electrode, yielding solar cells with significantly improved photocurrent."

Similarly Tsuboi etal. (15) teach trilayer-graphene/$MoS_2$/n-Si solar cell. They teach: "The $MoS_2$ plays an important role of passivation layer for separation the graphene and Si to reduce the interface carrier recombination. The tunneling barrier effect by the passivation layer with a thickness of several nanometers to several tenths of nanometers prevents direct contact between the semiconductor and conductive layers and can thereby suppress the recombination losses at the interface efficiency. Moreover, because of the difference between Fermi levels, the bottom of the conduction band and the top of the valence band of the $MoS_2$ layer at the interface of graphene are shifted upward, resulting in the energy barrier at the interface between $MoS_2$ and n-Si. The energy barrier of the $MoS_2$ layer functions as an effective electron blocking layer for the photogenerated electrons in the Si layer. Furthermore, in the case of the photogenerated hole, the energy barrier created by the $MoS_2$ layer functions as an effective hole-transport layer. The effective carrier transporting (blocking) layer of $MoS_2$ effectively reduces the recombination loss of carriers, which in turn results in an increase of the JSC. Therefore, the $MoS_2$ layer between the graphene and n-Si contribute to the enhancement of photovoltaic performance as a carrier transporting (blocking) layer.

Silicon, despite its ubiquity in solar cells, is not readily available in a flake shape. Some dichalcogenides and layered semiconductor materials are available in flake shapes, and are suitable as ingredients for solar cells, and can function somewhat like silicon. Here is a non-limiting list of flake shape semiconductor ingredients: 2D Dichalcogenides like $MoS_2$, $WS_2$, $MoSe_2$, $WSe_2$; Semiconducting Dichalcogendies: $MoTe_2$, $WTe_2$, $ZrS_2$, $ZrSe_2$ Metallic Dichalcogenides: $NbSe_2$, $NbS_2$, $TaS_2$, $TiS_2$, $NiSe_2$; and Layered Semiconductors: GaSe, GaTe, InSe, $B_2$, Se3.

In some embodiments dichalcogenides and other layered semiconductors can be substituted as the third flake for the silicon layer, forming a 3 layer P/$MoS_2$/N solar cell with Schottky-Barrier, i.e. Graphene/$MoS_2$/Layered Semiconductor, or Graphene/$MoS_2$/$MoS_2$ flake.

In some embodiments these substitutes for silicon flakes would have a potential opposite that of the $MoS_2$ flake, and would be electrostatically attracted to the $MoS_2$ flake. Since the $MoS_2$ flake protrudes from the top surface of the dielectric resin, the newly deposited third flakes would form electrostatic bonds and van der waals bonds with the $MoS_2$ flake, and would also contact the dielectric resin surrounding the $MoS_2$ flake. After the drying of the dispersion solvent, these third flakes would remain contacted to the $MoS_2$ flakes and repose roughly parallel to the top surface of the dielectric layer, and contacted to the top surface of the dielectric layer.

As a result of the tensile strength of a third flake like $MoS_2$, in some embodiments, $MoS_2$ flakes would conform their shape to the surface texture of the dielectric layer. If the third flakes are deposited on to the top surface of the dielectric layer, the $MoS_2$ flakes would conform to the surface and adopt the shape of the surface texture of the polymerized top surface of the dielectric layer.

Further, adhesion promoters, specialized silanes, and ligands, to name a few, would bond the third flakes reposing on the surface of the dielectric layer to the dielectric layer. This enables conformal contact of the third flakes to the incongruities of the top surface of the dielectric layer, causing the third flakes to replicate the texture of the polymerized top surface of the dielectric layer. In some embodiments the top surface of the dielectric layer would have the texture of a periodic surface structure. Such periodic surface structures can be cast into the top surface of the dielectric layer, in a process known in printing jargon as "cast and cure". So in some embodiments the third flakes would adopt the shape of the periodic surface structure. It is known to use silicone oil as an ingredient to optimize the release characteristics of periodic surface structures.

In some embodiments a charge transfer layer would be printed on top of the third flake.

In some embodiments, the additional simplified printing steps would be thus appended downstream of the printing steps described earlier in this application:

i. deposing a liquid dispersion of the third flakes in proximity to the protruding portion of the $MoS_2$ flakes, and the third flakes are electrostatically attracted to the $MoS_2$ flakes, because the flakes have differing electric potentials, j. the third flake coating is dried, removing the liquid solvent, k. a charge transfer layer is printed and dried, evaporating the liquid solvent, l. a top electrode is printed on top of the plurality of third flakes.

Electrostatic Deposition and Other Printing Processes

A conductive charged electrode induces a charge to a plurality of dichalcogenide flakes due to ohmic contact with the conductive charged electrode. A dielectric layer is interposed between a charged substrate and the electrode, the dielectric layer coated on to the charged substrate. Then subjecting at least a portion of the electrically charged and induction charged flakes to an electrical field between the electrode and the conductive substrate, dielectric layer; and causing the at least a portion of the electrically charged and induction charged flakes to migrate due to an electrostatic force based on at least the electrical field and a conductivity of the respective flakes, transiting and piercing into the surface of the dielectric layer, the dielectric layer being configured to prevent discharge of the charged flakes and thereby selectively causing an electrostatic accumulation buried into the dielectric layer, and the conductive substrate being configured to discharge the induced charge on the electrically charged and induction charged flakes with an opposite polarity induced charge, by contact with the conductive substrate, to thereby selectively inhibit electrostatic accumulation of the flakes on the surface of the conductive substrate exposed to the dielectric layer, wherein the flakes have a major axis, and wherein the electrical field affects an alignment of the major axis of the flakes, further preserving the alignment of the major axis of the migrated flakes to form a uniform coating of the flakes with one portion of the flake buried within the dielectric layer, and the other portion of the flake protruding from the dielectric layer, the flake having an orientation approximately normal to the planar surface. Afterwards the dielectric layer is polymerized and changes state to a stiff gel, a semi solid, or a solid state, fixing the flakes permanently with their major axis approximately normal to the conductive substrate.

U.S. Pat. No. 8,066,967B2, 2011, Eberlein etal. teaches: "The processes described (to deposit carbon nanofibers) . . . " (but in our embodiments, to deposit dichalcogenide flakes) " . . . depends on two forces: The coulomb force-charge times electrostatic field intensity AND the dielectrophoretic force permittivity times the gradient of the electrostatic field."

U.S. Pat. No. 8,066,967 B2, 2011, Eberlein etal. also teaches "once the carbon nanofibers are adhered to the cathode, they become asymmetric, allowing one end only to be derivatized or otherwise subject to different mechanical, electrical, or chemical conditions." Applying an electrostatic voltage perpendicular to a surface of the nano-porous substrate aligns the plurality of carbon nanotubes perpendicular to the surface.

$MoS_2$ is strongly responsive to electromagnetic fields. And the $MoS_2$ flake has its strongest electromagnetic response along the major axis of the flake, which is synonymous with the longest axis of the flake.

Electromagnetic field deposition of dichalcogenides occurs as a result of industrial processes such as inkjet printing, continuous inkjet printing (CIJ), xerography, electrophotography, photocopying, laser printing, electrophoretic aka electrophoresis, pressure less printing, corona poling, electrostatic spraying, flocking, among other processes.

During electromagnetic deposition processes, an electrical charge is applied proximal to the $MoS_2$ flakes. The charge potential can be positive or negative. After an electrical charge is applied to the $MoS_2$ flakes, the flakes is brought into proximity to a substrate or electrode of the opposite electrical charge, causing the flakes to be attracted to the oppositely charged substrate or electrode.

Since the greatest charge polarity is along the major axis of the flakes, each flake is planted with its major axis approximately normal to the electrode or substrate.

In some embodiments the electrode or substrate with the opposite charge is coated with a dielectric layer, or other layers. The edge of the flake penetrates the dielectric layer, creating conformal contact with the electrode, creating ohmic contact with the electrode.

In some embodiments the molybdenum metal atom has available valence domains which can associate with the available electrons of the charge transfer layers or electrode. The orbitals of the molybdenum atom overlap those of the electron orbitals of the charge transfer layer atoms, creating ohmic contact between the molybdenum atom and the charge transfer layers.

Consider a generic, but non-limiting example of an ohmic interaction between the valence domains of a molybdenum disulfide molecule and the valence electrons of an exemplary charge transfer molecule, a polythiophene molecule. The orthogonal p electrons from the pi bonds in the thiophene ring donate electron density binding the Molybdenum atom comprising the Dichalcogenide Flake. This type of interaction is known as a dative bond or coordinate covalent bond. The thiophene acts as a pi electron donor ligand. Other examples of bonds, such as ionic bonds, polar covalent bonds, and others can also form ohmic interactions. The Dichalcogenide Flake has available valencies that associate with the valence electrons of adjacent charge transfer molecules, said association being ohmic interaction. The electrical conductivity between the valence domains of the molybdenum sulfide flake and the electrons of the adjacent charge transfer molecules is at least about $1 \times 10^{6th}$ Siemens per meter.

The charged flake remains oriented approximately normal to the electrode with the opposite charge. In some embodiments the dielectric layer is comprised of an ultraviolet radiation curing resin. After the flake is planted in the ultraviolet curing resin, the low viscosity resin is cured, and the flake is permanently oriented approximately normal to the electrode. One portion of the flake remains buried in the resin, while the remainder of the flake protrudes from the surface of the resin, the dielectric layer.

In some embodiments the oppositely charged electrode is a relatively soft durometer conductive polythiophene. In some cases, the flake is attracted with such strong force that the flake pierces into the surface of the conductive polythiophene electrode. In some embodiments, the molybdenum atom has available valence domains associating with the available electrons of the atoms of adjacent charge transfer molecules, the pi electrons of the thiophene ring of the PEDOT molecule, the polythiophene said association being ohmic contact between said valence domains of the flake and said available electrons of these charge transfer molecules.

Printing Processes, Properties, to Depose Heterojunction Layers

The printing registration tolerance of a printing press is the relative deposing placement ranges between one deposed material and another deposed material on the same substrate. For example, with ordinary flexographic printing presses, the printing registration tolerance is estimated at plus or minus 0.0015 inches. In some of these embodiments, the registration of the diode layers is twice the registration tolerance of the printing press, which for a flexographic printing press would be 0.003 inches.

Many ordinary flexographic printing presses, sometimes called flexo label printers, can faithfully reproduce 150 nanometer thick dielectric layers with tolerances of plus or minus 50 nanometers. In some of our embodiments, the z axis conduction between the source electrode and drain electrode occurs across a gap which is approximately 150 nanometers thick, which reduces parasitic capacitance.

Ordinary commercial printing presses can easily print the diode layers in register within 2 times the printing device's ordinary registration tolerance.

Examples of some ordinary commercial presses that are suitable for printing these novel embodiments are flexographic printing, gravure printing, tampon printing, intaglio printing, screen printing, inkjet printing, web printing, offset printing, silkscreen printing, and pad printing.

In some non-limiting embodiments, a diode structure can be printed using a continuous web printing press with the following simplified steps:
1. unwind the substrate
2. clean the substrates
3. print the pedot/psst source electrode and then dry the pedot electrode
4. print the dielectric layer
5. optionally charge the bottom electrode with an electrical charge, to attract the flakes in this following step
6. deposit the dichalcogenide flakes using an inkjet station, or xerography station, or other deposition method
7. cause the dielectric layer to change state to a higher viscosity, e.g. ultraviolet cure it.
8. optionally overprint the exposed flakes with a dopant an impurity or a ligand or other additive, or other doping method and then
9. optionally dry the dopant coating, or ligand coating, or other additive coating
10. optionally irradiate the dopant and the exposed portions of the flakes to a laser beam, an electron beam, or a plasma
11. print the top pedot/psst electrode using a print station, or an inkjet printhead station, and then dry the top electrode
12. print the pdms silicone, or silicone oil coating or the pvdf (polyvinylidine fluoride) coating or the Cytop coating to inhibit coulomb scattering and then dry the coating
13. print the saran (polyvinylidene chloride) resin or other barrier resin and dry the barrier resin Semiconductors and Dielectrics Solid-state materials are commonly grouped into three classes: insulators, semiconductors, and conductors. (At low temperatures some conductors, semiconductors, and insulators may become superconductors) c. Insulators such as fused quartz and glass, have very low conductivities, on the order of $10^{-18}$ to $10^{-10}$ siemens per centimeter; and conductors have high conductivities, typically from $10^4$ to $10^6$ Siemens per centimeter. The conductivities of semiconductors are between these extremes and are generally sensitive to temperature, illumination, magnetic fields, and minute amounts of impurity dopant atoms. For example, the addition of about 10 atoms of boron per million atoms of silicon can increase its electrical conductivity a thousand-fold.

Intrinsic Semiconductor

In the classic crystalline semiconductors, electrons can have energies only within certain bands (ranges of energy levels). The energy of these bands is between the energy of the ground state and the free electron energy (the energy required for an electron to escape entirely from the material). The energy bands correspond to many discrete quantum states of the electrons. Most of the states with low energy (closer to the nucleus) are occupied, up to a particular band called the valence band.

Semiconductors and insulators are distinguished from metals by the population of electrons in each band. The valence band in any given metal is nearly filled with electrons under usual conditions. In semiconductors, only a few electrons exist in the conduction band just above the valence band, and an insulator has almost no free electrons.

Semiconductors and insulators are further distinguished by the relative band gap. In semiconductors, the band gap is small, allowing electrons to populate the conduction band. In insulators, it is large, making it difficult for electrons to flow through the conduction band.

Extrinsic Semiconductor

The name "extrinsic semiconductor" can be a bit misleading. While insulating materials may be doped to become semiconductors, intrinsic semiconductors can also be doped, resulting in an extrinsic semiconductor. There are two types of extrinsic semiconductors that result from doping: atoms that have an extra electron (n-type for negative, from group V, such as vanadium) and atoms that have one fewer electron (p-type for positive, from group III, such as boron).

In semiconductor production, doping intentionally introduces impurities into an extremely pure, or intrinsic, semiconductor for the purpose of changing its electrical properties. The impurities depend on the type of semiconductor. Lightly and moderately doped semiconductors are referred to as extrinsic. When a semiconductor is doped to such a high level that it acts more like a conductor than a semiconductor, it is referred to as degenerate.

N-type semiconductors are a type of extrinsic semiconductor in which the impurity atoms are capable of providing extra conduction electrons to the host material. This creates an excess of negative (n-type) electron charge carriers.

Impurity dopant atoms and molecules usually have one more valence electron than the host atoms. The most common example is atomic substitution in group-IV solids by group-V elements. The extra valence atoms provided by the impurity or dopant allow the semiconductor to function as an N type semiconductor. III-V semiconductors such as gallium arsenide and silicon can function as donors when they substitute for gallium or acceptors when replacing arsenic. Some donors have fewer valence electrons than the host, such as alkali metals, which are donors in most solids.

A p-type (p for "positive") semiconductor is created by adding a certain type of atom to the semiconductor in order to increase the number of free charge carriers. When the doping material is added, it takes away (accepts) weakly bound outer electrons from the semiconductor atoms. This type of doping agent is also known as an acceptor material, and the vacancy left behind by the electron is known as a hole. The purpose of p-type doping is to create an abundance of holes.

In the case of silicon, a trivalent atom is substituted into the crystal lattice. The result is that one electron is missing from one of the four covalent bonds normally part of the silicon lattice. Therefore, the impurity atom can accept an electron from a neighboring atom's covalent bond to complete the fourth bond, this promotes effective charge transfer through p type doping.

When the impurity atom accepts an electron, this causes the loss of one paired electron from the neighboring atom, resulting in the formation of a hole. Each hole is associated with a nearby negatively charged dopant ion, and the semiconductor remains electrically neutral overall. However, once each hole has wandered away into the lattice, one proton in the atom at the hole's location will be "exposed" and no longer canceled by an electron. This atom will have three electrons and one hole surrounding the nucleus with four protons.

For this reason, a hole behaves as a positive charge. When a sufficiently large number of acceptor atoms are added, the holes greatly outnumber thermally excited electrons. Thus, holes are the majority carriers, while electrons become minority carriers in p-type materials.

Edge Contact, OHMIC Contact

The $MoS_2$ flake is affected by electromagnetic fields. And the $mos_2$ flake has its strongest electromagnetic response along the major axis of the flake, which is synonymous with the longest axis of the flake.

During these electromagnetic deposition processes, an electrical charge is applied to the $MoS_2$ flake. The charge can be positive or negative. After an electrical charge is applied to the $MoS_2$ flake, the flake is brought into proximity to a substrate or electrode of the opposite electrical charge, causing the flake to be attracted to the oppositely charged substrate or electrode.

Since the greatest charge polarity is along the major axis of the flake, the flake is planted with its major axis approximately normal to the electrode or substrate. The edge of the flake contacts the charge transfer layer or the electrode layer.

The wording "approximately parallel" top surfaces of electrodes, layers, etc. as referred to in these embodiments, includes, as a matter of course, the case where any angle formed by the top surfaces or layers is 0 degrees. The wording also includes the case where a slight inclination to an extent such that the foregoing angle can be considered to be substantially parallel is present (for example, the case where the foregoing angle is 10 degrees or less, and preferably 5 degrees or less, and most preferred, 2 degrees or less.)

In these embodiments, the top surfaces of the electrodes, the layers, etc. are approximately parallel to each other. When the top surfaces of the electrodes, the layers, etc. are approximately parallel to each other, the angle formed by each other is within the range that the effects of these embodiments are achieved.

The wording particles oriented in a direction "approximately normal" to a top surface of said substrate, said top surface of said bottom electrode, and said top surface of said top electrode, as referred to in these embodiments, includes, as a matter of course, the case where any angle formed by the major axis of each particle and the top surface is 90 degrees. The wording also includes the case where a deviation from 90 degrees to an extent such that the foregoing angle can be considered to be substantially normal is present (for example, the case where the foregoing angle deviates from normal by 10 degrees or less, or the foregoing angle deviates from normal by 5 degrees or less, and preferably the foregoing angle deviates from normal by 2 degrees or less.)

In these embodiments, the major axis of each particle and a top surface of said substrate are oriented approximately normal to each other. Likewise the major axis of each particle and said top surface of said bottom electrode are oriented approximately normal to each other. And similarly the major axis of each particle and said top surface of said top electrode are oriented approximately normal to each other. When these elements are approximately normal to each other, the angle formed by each other is within the range that the effects of these embodiments are achieved.

Continuous Biphasic Flake, a Heterojunction

In some embodiments, as the mixture of dichalcogenide flakes and solvent transit, the solvent evaporates as the motion of the flake continues. It is attracted to the oppositely charged substrate or electrode, and buries a portion itself into the dielectric layer, with its major axis having an orientation approximately normal to the substrate or electrode. If the flake has a major axis longer than the thickness of the dielectric layer, then the opposite end of the flake remains protruding from the surface of the dielectric layer. In some embodiments the protruding portion of the flake is modified with dopants or impurities which change the characteristics of the flake, generally changing the work function of the protruding portion. In some embodiments the dielectric layer functions as a mask or barrier preventing the impurities from penetrating into the dielectric layer and contaminating the portion of the flake buried in the dielectric layer. In some embodiments the protruding portion of the flake is doped with atoms like Oxygen, Nitrogen, Rhenium, Niobium, Zinc, Tungsten, Molybdenum, Iron, Chromium, Manganese, Vanadium, Selenium, Sulfur, Tellurium, Phosphorus, Potassium, Hydrogen, and Chlorine. In these embodiments the flake is described as bi-phasic. In these embodiments the portion of the flake which is buried in the dielectric layer retains the original characteristics of the flake, while the portion of the flake protruding from dielectric layer is changed by the impurities. After doping, the flake has two phases, that is, it is a heterojunction. But since the dichalcogenide is a single continuous flake, it is a heterojunction with little or no contact resistance between the n type portion of the flake and the p type portion of the flake.

It is known that edge contact between the edge of the $MoS_2$ flake and its electrode has greater ohmic efficiency than the contact between the bulk surface of the $MoS_2$ flake and an adjacent electrode. As a result of processes like electrostatic deposition, the flake is deposited approximately normal to the oppositely charged electrode, depositing the thin edge of the flake contacting to the electrode, enabling high ohmic efficiency edge contact. The authors of [11] teach that "In the case of edge contact, stronger orbital overlap was observed at the metal/2D material interface, and a lower tunneling barrier . . . ."

"Surface charge transfer doping techniques were achieved by spin-coating (BV, AuCl3, and F4TCNQ (2,3,5,6-Tetrafluoro-7,7,8,8-tetracyanoquinodimethane), drop-casting (TCNQ, and F4TCNQ), gas flow (K, and $NO_2$), deposition ($Cs_2CO_3$, and MoO3) on the 2D material samples, or immersion (AuCl3) of the samples in solution. In particular, $MoS_2$ and $WSe_2$ were doped to the degenerate level using BV, AuCl3, K, and $NO_2$. Fang reported high performance $MoS_2$- and $WSe_2$-based FETs with high field-effect mobility by degenerately doping the source/drain (S/D) regions with K and $NO_2$ molecules." [16]

"Phase patterning has largely been used to lower the contact resistance of TMDC devices, by inducing the formation of the metallic 1T phase beneath metal contacts . . . . For example, The contact resistance was lowered from 1.1 km for 2H contacts to ~0.2 km for 1T contacts using this technique Inducing an ohmic contact between 2H/1T TMDCs also can increase FET device mobility and reduce sub threshold swing while maintaining a high on/off ratio. The immense benefits of phase engineering on FET device performance warrants the inclusion of this processing technique when fabricating high-performance devices." [17]

When two semiconductors with opposite carrier type contact one another, charge transfer occurs across their interface and creates a potential difference determined by the doping profile. In bulk semiconductor p-n junctions, the doping level is primarily controlled via diffusion or implantation of substitutional impurities or electrostatic doping. The atomically thin structure of these materials enables doping modulation of the TMDC flake.

However, as the dimension of these materials are reduced, the edge effects become very prominent, leading to change in their structure as well as properties. $MoS_2$ with zig zag edges undergo semiconducting to metallic and non-magnetic to ferromagnetic transitions accompanied with the dimension reduction. Besides, tuning the magnetic and electronic properties, edge effects also leads to change in the catalytic performance of $MoS_2$. Sometimes vacancies occur in the $MoS_2$ flake edges and the basal planes of the $MoS_2$ flake. These vacancies are binding sites for novel functionality ligands to bind with the $MoS_2$.

In some embodiments, the dichalcogenide flakes have available valence domains associating with the available electrons of adjacent impurities. In some embodiments, these impurity electrons adjacent to the dichalcogenide flakes valence domains associate with the valence domains and change the work function of that portion of the dichalcogenide flake where these impurities are implanted.

Transparent Diodes

Currently scientific writers define that a monolayer of $MoS_2$ is a single triad of a layer of molybdenum sandwiched between 2 lattices of sulfurs. Few layer $MoS_2$ is 2-4 triads. Many layers is 4-8 $MoS_2$ triads. And bulk $MoS_2$ is more than 8 triads, generally thicker than 100 nanometers, and is not transparent to visible light. In some embodiments, the dichalcogenide particles are flake shape and have an edge thickness measuring between 0.5 nanometers and 100 nanometers.

Monolayer and few layer $MoS_2$ flakes are transparent in the visible. More than few layers and many layer $MoS_2$ flakes are transparent to semitransparent.

PEDOT/PSST electrodes are often transparent in the visible. Likewise, the UV curing resins or other materials comprising the dielectric layer betwixt the diode electrodes are usually transparent, or semi-transparent. Therefore, the diode structure is mostly transparent, given that the diode ingredients are mostly transparent.

When used as transparent diodes for LCD displays or LED displays, very little light emitted by the display light generating devices is absorbed by the diodes, so light emission from the display backlight can be reduced. Since the light emission from the display light generating devices is reduced, the displays consume less electricity (and operate on batteries for a longer duration.). In some prior art flat panel displays, the actual display pixel aperture is less than 65%. In some of these novel embodiments, transparent diodes will enable displays with pixel apertures exceeding 80%.

Thus the reader will see that at least one embodiment of the heterojunction provides: (A) Some embodiments incorporate heterojunction particles with ohmic contact, and hence have significant speed; (B) Some embodiments incorporate heterojunction particles which are simple to manufacture and depose; (C) Some embodiments are manufactured using ordinary printing equipment; (D) Some embodiments include flakes of various thicknesses, flakes which are more simple to manufacture than 2 dimensional flakes; (E) Some embodiments are transparent or semitransparent; and (F) Some embodiments allow quick and facile doping of impurities to the heterojunctions.

While my above description contains many specificities, these should not be construed as limitations on the scope, but rather as an exemplification of one (or several embodiment(s) thereof. Many other variations are possible. Accordingly, the scope should be determined not by the embodiment(s) illustrated, but by the appended claims and their legal equivalents.

I claim:

1. A P-N heterojunction comprising:
a substrate;
a dielectric layer including a plurality of semiconducting dichalcogenide particles;
a bottom electrode in contact with said dielectric layer; and
a top electrode in contact with said dielectric layer and spaced apart from said bottom electrode;
wherein:
a top surface and a bottom surface of each said bottom electrode and said top electrode is at least approximately parallel to a top surface of said dielectric layer;
said dielectric layer has a portion sandwiched within a gap between said bottom electrode and said top electrode;
each of said plurality of semiconducting dichalcogenide particles contact said bottom electrode and said top electrode to bridge said gap; and
a major axis of each of said plurality of dichalcogenide particle is oriented in a direction approximately normal to each of a top surface of said substrate, said top surface of said bottom electrode, and said top surface of said top electrode.

2. The P-N heterojunction of claim 1, wherein each of said plurality of semiconducting dichalcogenide particles is flake shaped and has an edge thickness between 0.5 nanometers and 100 nanometers.

3. The P-N heterojunction of claim 1, wherein said dielectric layer includes at least one of radiation curable pre-polymers, thickeners, high dielectric value materials, and carriers.

4. The P-N heterojunction of claim 1, further comprising impurities implanted into at least one of a protruding portion of at least one of said plurality of semiconducting dichalcogenide particles.

5. The P-N heterojunction of claim 1, wherein said P-N heterojunction is selected from the group consisting of a diode, a zener diode, a schottky diode, a rectifying circuit diode, a P-N diode, and a heterojunction solar cell.

6. The P-N heterojunction of claim 1, wherein said plurality of semiconducting dichalcogenide particles is positioned on said dielectric layer using at least one of inkjet printing, continuous inkjet, printing, xerography, electrophotography, photocopying, laser printing, electrophotography, electrophoresis, pressure less printing, corona poling, electrostatic spraying, and flocking.

7. The P-N heterojunction of claim 1, wherein said a plurality of semiconducting dichalcogenide particles is selected from the group consisting of MoS2, WS2, MoSe2, WSe2, MoTe2, WTe2, ZrS2, ZrSe2, NbSe2, NbS2, TaS2, TiS2, and NiSe2.

* * * * *